US012660319B2

(12) United States Patent
Zhao et al.

(10) Patent No.: US 12,660,319 B2
(45) Date of Patent: Jun. 16, 2026

(54) ARRAY SUBSTRATE AND PREPARATION METHOD THEREOF AND DISPLAY PANEL

(71) Applicant: Wuhan Tianma Microelectronics Co., Ltd., Wuhan (CN)

(72) Inventors: Xu Zhao, Wuhan (CN); Xianchi Wang, Wuhan (CN); Rusheng Liu, Wuhan (CN); Qiyong Ke, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 363 days.

(21) Appl. No.: 18/223,701

(22) Filed: Jul. 19, 2023

(65) Prior Publication Data

US 2023/0361133 A1     Nov. 9, 2023

(30) Foreign Application Priority Data

Jan. 13, 2023     (CN) .......................... 202310068546.X

(51) Int. Cl.
| | |
|---|---|
| *H10D 86/60* | (2025.01) |
| *H10D 86/01* | (2025.01) |
| *H10D 86/40* | (2025.01) |
| *H10W 90/00* | (2026.01) |

(52) U.S. Cl.
CPC ........... *H10D 86/60* (2025.01); *H10D 86/021* (2025.01); *H10D 86/451* (2025.01); *H10W 90/00* (2026.01)

(58) Field of Classification Search
CPC ...... H10D 86/60; H10D 86/021; H10D 86/01; H10D 86/451; H10D 86/40; H10D 86/423; H10D 86/481; H10D 30/6734; H10D 30/67; H10D 30/6723; H10D 30/6739; H10D 30/0321; H10D 30/01; H10D 30/6745; H01L 25/167; H01L 25/16; H01L 25/0753; H01L 25/18; H10W 90/00
See application file for complete search history.

(56) References Cited

U.S. PATENT DOCUMENTS

| | | | | |
|---|---|---|---|---|
| 11,744,121 B2* | 8/2023 | Hsieh | .................... | H10K 59/122 |
| 2021/0013285 A1* | 1/2021 | Hsieh | ..................... | H10K 59/65 |

FOREIGN PATENT DOCUMENTS

| | | |
|---|---|---|
| CN | 110289301 A | 9/2019 |
| CN | 114914253 A | 8/2022 |
| CN | 117156891 A | 12/2023 |

* cited by examiner

*Primary Examiner* — Nikolay K Yushin
(74) *Attorney, Agent, or Firm* — KDW Firm PLLC

(57) ABSTRACT

Provided are an array substrate and a preparation method thereof and a display panel. The array substrate includes a base, a drive layer and a first light-shielding layer. The drive layer is formed on the base, a first opening is configured in the drive layer, the drive layer has a first side wall at the first opening, and the first side wall has at least one step. The first light-shielding layer is formed on the drive layer and extends to the first side wall.

18 Claims, 21 Drawing Sheets

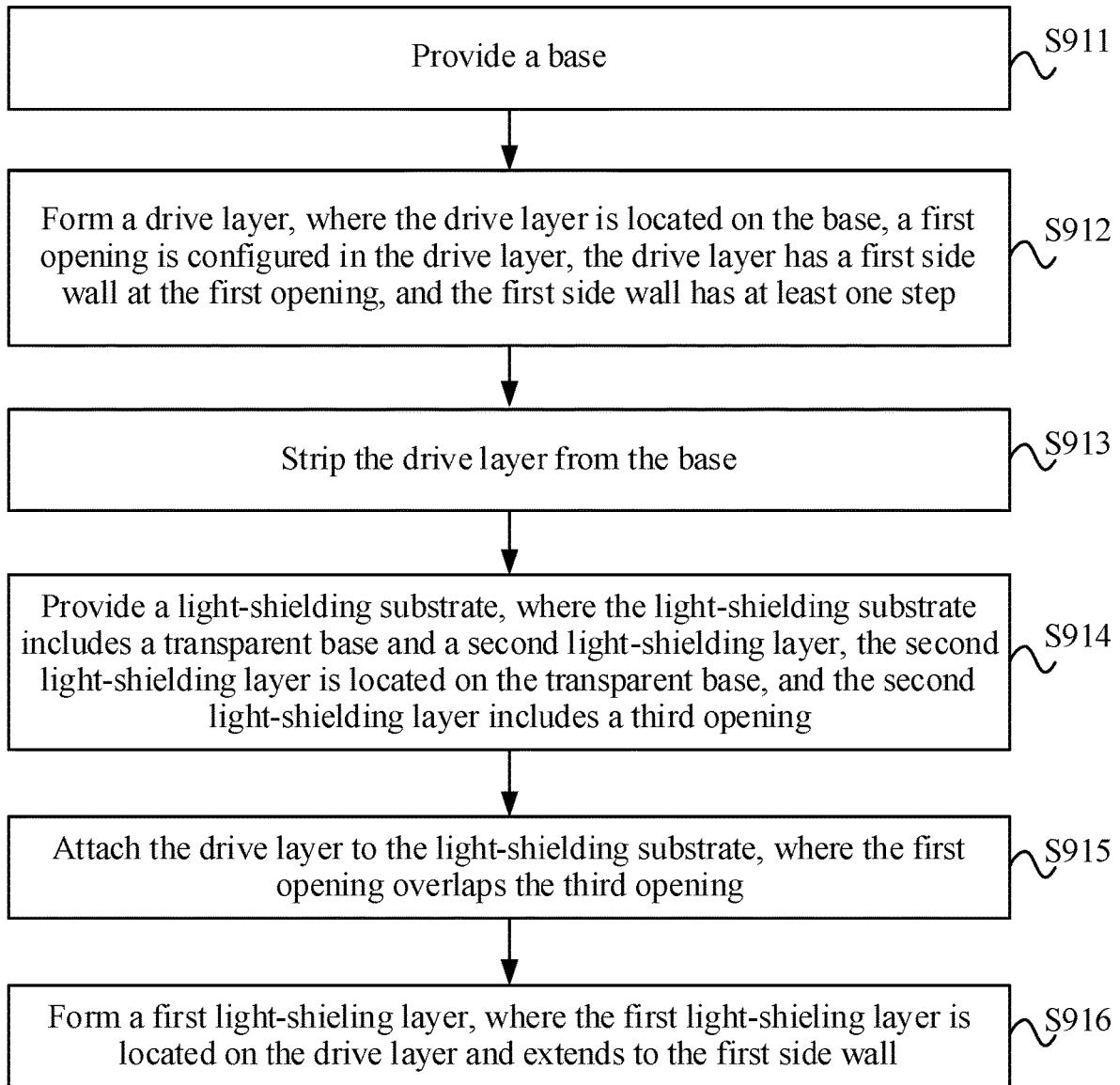

Provide a base    S911

Form a drive layer, where the drive layer is located on the base, a first opening is configured in the drive layer, the drive layer has a first side wall at the first opening, and the first side wall has at least one step    S912

Strip the drive layer from the base    S913

Provide a light-shielding substrate, where the light-shielding substrate includes a transparent base and a second light-shielding layer, the second light-shielding layer is located on the transparent base, and the second light-shielding layer includes a third opening    S914

Attach the drive layer to the light-shielding substrate, where the first opening overlaps the third opening    S915

Form a first light-shieling layer, where the first light-shieling layer is located on the drive layer and extends to the first side wall    S916

FIG. 38

ARRAY SUBSTRATE AND PREPARATION METHOD THEREOF AND DISPLAY PANEL

CROSS-REFERENCE TO RELATED APPLICATION(S)

This application claims priority to Chinese Patent Application No. 202310068546.X filed Jan. 13, 2023, the disclosure of which is incorporated herein by reference in its entirety.

TECHNICAL FIELD

The present disclosure relates to the field of display technologies and, in particular, to an array substrate and a preparation method thereof and a display panel.

BACKGROUND

The transparent display itself has a certain degree of light transmittance, allowing users to see the background behind the display while viewing the display picture of the display. Therefore, the transparent display is generally used in building windows, automobile windows, shop windows, etc.

Specifically, the transparent display includes a light-transmitting region through which users can view the background behind the display and a non-light-transmitting region in which display pixels are disposed for displaying a picture. A transparent display being disposed in an automobile window is taken as an example. The driver can observe the road condition in front through the light-transmitting region and view a navigation picture displayed on the display through the non-light-transmitting region.

In the related art, the light transmittance is improved by forming an opening on the array substrate corresponding to the light-transmitting region; in addition, the reflectivity of the internal structure of the array substrate can be reduced by covering the non-light-transmitting region with a light-shielding material. However, the film adhesion between the existing light-shielding material and the base is relatively poor, so that the problem of film layer peeling easily occurs.

SUMMARY

The present disclosure provides an array substrate and a preparation method thereof and a display panel to avoid the problem of film layer peeling of a first light-shielding layer on a drive layer.

In a first aspect, the present disclosure provides an array substrate. The array substrate includes a base, a drive layer and a first light-shielding layer.

The drive layer is formed on the base, first openings are configured in the drive layer, the drive layer has a first side wall at the first opening, and the first side wall has at least one step.

The first light-shieling layer is formed on the drive layer and extends to the first side wall.

In a second aspect, the present disclosure further provides a display panel including the array substrate configured in any embodiment of the present disclosure and a light-emitting element. The light-emitting element is located on one side of the drive layer away from the base, and the light-emitting element is electrically connected to the drive layer.

In a third aspect, the present disclosure further provides an array substrate preparation method including steps described below.

A base is provided.

A drive layer is formed, where the drive layer is located on the base, first openings are configured in the drive layer, the drive layer has a first side wall at the first opening, and the first side wall has at least one step.

A first light-shieling layer is formed, where the first light-shieling layer is located on the drive layer and extends to the first side wall.

According to the technical solution in the embodiment of the present disclosure, the drive layer includes the first side wall having at least one step at the first opening, so that the first light-shielding layer can extend to the first side wall, the first light-shielding layer can end on the step surface of the first side wall, and the contact between the first light-shielding layer and the base is avoided; therefore, the peeling phenomenon of the first light-shielding layer can be avoided while the light-shielding effect is improved, and thus the quality of the array substrate is ensured.

It is to be understood that the content described in this part is not intended to identify key or important features of the embodiments of the present disclosure and is not intended to limit the scope of the present disclosure. Other features of the present disclosure will become readily understood through the description hereinafter.

BRIEF DESCRIPTION OF DRAWINGS

To illustrate technical solutions in embodiments of the present disclosure more clearly, drawings used in description of the embodiments will be briefly described below. Apparently, the drawings described below illustrate part of the embodiments of the present disclosure, and those of ordinary skill in the art may obtain other drawings based on the drawings described below on the premise that no creative work is done.

FIG. 38 is a flowchart of another array substrate preparation method according to an embodiment of the present disclosure.

DETAILED DESCRIPTION

The technical solutions in embodiments of the present disclosure will be described clearly and completely in conjunction with the drawings in the embodiments of the present disclosure from which the solutions of the present disclosure will be better understood by those skilled in the art. Apparently, the embodiments described below are part, not all, of the embodiments of the present disclosure. Based on the embodiments described in the present disclosure, all other embodiments obtained by those of ordinary skill in the art on the premise that no creative work is done are within the scope of the present disclosure.

Figure 1:
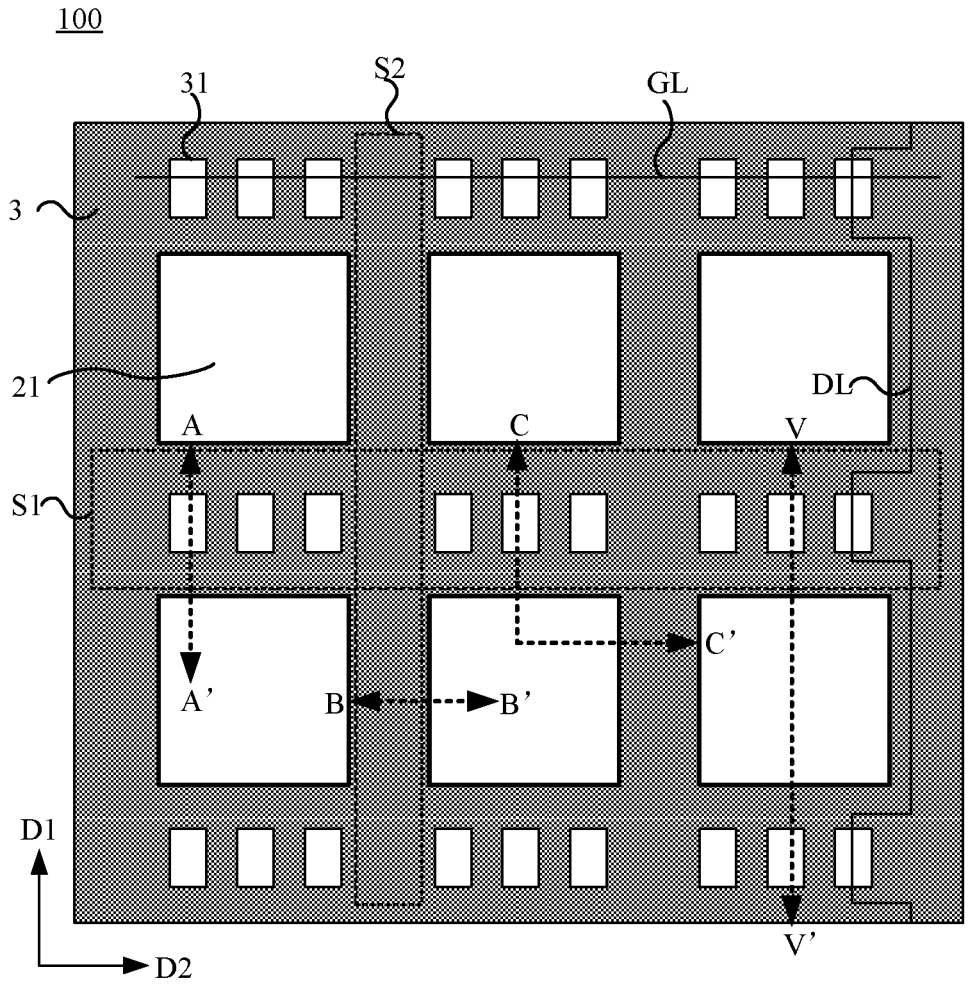
FIG. 1 is a top view of an array substrate according to an embodiment of the present disclosure.
Figure 2:
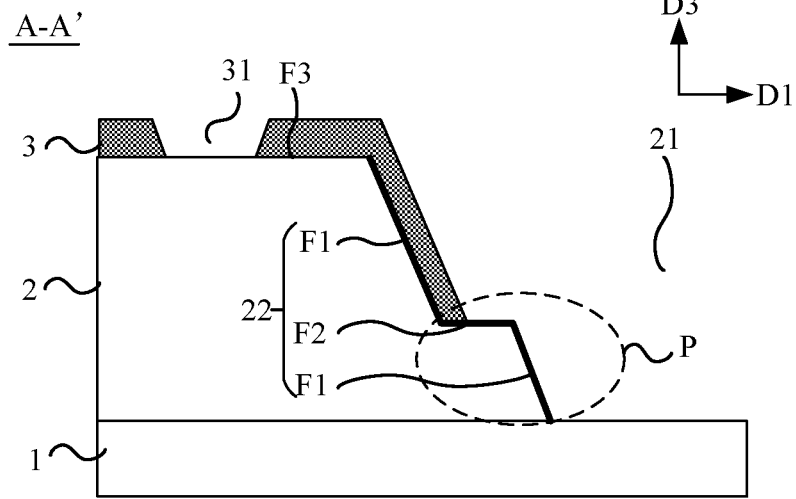
FIG. 2 is a sectional view of the array substrate taken along a section line A-A' in FIG. 1.

FIG. 1 is a top view of an array substrate according to an embodiment of the present disclosure, and FIG. 2 is a sectional view of the array substrate taken along a section line A-A' in FIG. 1. The array substrate may be applied in a transparent display panel. Referring to FIG. 1 and FIG. 2, the array substrate 100 configured in the embodiment of the present disclosure includes a base 1, a drive layer 2 and a first light-shielding layer 3. The drive layer 2 is formed on the base 1, first openings 21 are configured in the drive layer 2, the drive layer 2 has a first side wall 22 at the first opening 21, and the first side wall 22 has at least one step P. The first light-shieling layer 3 is formed on the drive layer 2, and the first light-shielding layer 3 extends to the first side wall 22.

Exemplarily, the material of the base 1 may include glass. The glass base has good light transmittance, so that the requirements for light transmittance of the transparent display panel can be satisfied, and a rigid substrate can be provided for subsequently-formed film layers. Of course, in other embodiments, the base of other materials may be selected, which is not limited in the embodiment of the present disclosure.

Subpixels in the transparent display panel mainly include light-emitting elements and pixel driving circuits for driving the light-emitting elements to emit light, and the drive layer 2 in the array substrate 100 mainly includes structures such as the pixel driving circuits for driving the light-emitting elements to emit light and signal lines for transmitting signals to the pixel driving circuits. The structure of the drive layer 2 is specifically described subsequently and is not described here. It is to be understood that the preceding structures such as the pixel driving circuits and the signal lines are located at positions other than the first opening 21 in the drive layer 2.

The first opening 21 of the drive layer 2 may be configured at a position corresponding to the position of a light-transmitting region. Specifically, a region within the first opening 21 which is not covered by the first light-shielding layer 3 is the light-transmitting region. This region needs to have high light transmittance to achieve the transparent display. It is to be understood that a pixel driving circuit needs to be composed of multiple layers of conductive structures, and an insulating layer needs to be disposed between two adjacent layers of conductive structures. Since materials of various insulating layers may be different, refractive indices of various insulating layers may also be different; however, light will be reflected at interfaces of film layers with different refractive indices; therefore, even if no structure such as a pixel driving circuit or a signal line is disposed in portion of the drive layer in the light-transmitting region and only multiple insulating layers are disposed, a loss of light transmittance will exist due to the reflection phenomenon of light between the insulating layers with different refractive indices. The first opening 21 is configured in the drive layer 2 and corresponds to the light-transmitting region, so that at least part of insulating layers in the drive layer 2 in the light-transmitting region can be removed, and the number of film layers through which light passes when passing through the array substrate can be reduced; therefore, the reflection of light is reduced, the light transmittance of the light-transmitting region is improved, and the transparent display effect is improved.

Specifically, along a lamination direction (for example, direction D3 in FIG. 2) of film layers in the drive layer 2, in other words, along a thickness direction of the drive layer 2, the first opening 21 may penetrate through at least part of the film layers of the drive layer 2. It is to be noted that FIG. 2 only shows the example where the first opening 21 penetrates through the drive layer 2 and exposes the base 1, and this arrangement manner is not limiting. In other embodiments, the first opening 21 may penetrates through part of the film layers in the drive layer 2 and does not expose the base 1. In the embodiment, the first opening 21 penetrates through the drive layer 2, so that the light transmittance of the light-transmitting region can be improved as much as possible.

It is to be noted that FIG. 1 only shows the example where the drive layer includes multiple first openings 21 which are independent from each other, and this arrangement manner is not limiting. In other embodiments, the drive layer may include one first opening located in a region of which the orthographic projection on the base is in the form of a continuous grid. The drive layer 2 including multiple independent first openings 21 is only taken as an example for subsequent illustration.

It is further to be noted that when the drive layer includes multiple independent first openings 21, the section shape of each first opening 21 on a plane parallel to the base 1 may be any shape such as a polygon, a rounded polygon, a circle or an ellipse, which is not limited in the embodiment of the present disclosure. FIG. 1 only shows the example where the section shape of the first opening 21 on the plane parallel to the base 1 is a rectangle.

It is to be understood that after the first opening 21 is formed in the drive layer 2, the drive layer 2 has a side wall at the first opening 21 which encloses the first opening 21. The preceding "first side wall 22" may be understood as at least part of complete side walls enclosing the first opening 21, and the preceding "the first side wall 22 has at least one step P" may be understood as that at least part of the complete side walls enclosing the first opening 21 has at least one step. Specifically, it may be that side walls in various directions have steps; or side walls in part of directions have steps, and side walls in the other part of directions do not have step. Exemplarily, referring to FIG. 1 and FIG. 2, if the section shape of the first opening 21 on the plane parallel to the base 1 is a rectangle, the drive layer 2 has four side walls at the first opening 21, and the four side walls are connected to each other to enclose the first opening 21; at least one side wall of the four side walls may have a step, and each side wall having a step may be understood as a first side wall 22. Referring to FIG. 2, the first side wall 22 specifically includes inclined surfaces F1 and a step surface F2 between two adjacent inclined surfaces F1. It is to be noted that if the drive layer 2 includes multiple first side walls 22 at the first opening 21, step surfaces F2 of steps P of various first side walls 22 may be on the same level or may be on different levels, which is not limited in the embodiment of the present disclosure. It is to be noted that to clearly illustrate the first side wall 22, thick lines are used in the figure. The first side wall 22 may be understood as a side portion of the drive layer 2 after part of the structure of the drive layer 2 is removed.

As shown in FIG. 2, the first light-shielding layer 3 is further disposed on the drive layer 2, and the first light-shielding layer 3 extends to the first side wall 22. In this manner, the first light-shielding layer 3 can be used for covering at least part of the internal structure of the drive layer 2, so that the problem of light reflection is improved. Exemplarily, the material of the first light-shielding layer 3 may be a black optical adhesive for absorbing light emitted towards the drive layer 2 and absorbing light reflected outwards by the internal structure of the drive layer 2, so that the problem of light reflection is improved.

Specifically, in the preparation process, after the first opening 21 is formed in the drive layer 2, the preparation of the first light-shielding layer 3 is performed. When the first light-shielding layer 3 is formed by using the black optical adhesive, it is necessary to first coat the drive layer 2 having the first opening 21 with the liquid black optical adhesive and then to cure the black optical adhesive. Referring to FIG. 2, optionally, along a direction (D3) pointing from the base 1 to the drive layer 2, the side wall (for example, the first side wall 22) of the drive layer 2 is inclined towards a direction away from the interior of the first opening 21. Since the black optical adhesive has fluidity, after an upper surface F3 of the drive layer 2 is coated with the liquid black optical adhesive, the black optical adhesive will flow along the side wall of the drive layer 2 into the low-lying first opening 21 to cover the side wall of the drive layer 2, so that the light shielding effect can be improved, and particularly, the light shielding effect of the light-shielding layer 3 on a thin-film transistor in the drive layer 2 can be improved, as compared with the case where the first light-shielding layer 3 only covers the upper surface F3 of the drive layer 2.

According to the research, it is found that if side walls of the drive layer are continuously-inclined surfaces, the black optical adhesive tends to flow along the inclined side walls of the drive layer to the base 1 and the black optical adhesive is in contact with the base 1. At this time, although a good light shielding effect can be achieved, if the back optical adhesive is in direct contact with the base 1, the first light-shielding layer 3 tends to peel from the base 1 due to the poor film adhesion between the black optical adhesive and the base 1 made of glass, affecting the quality of the array substrate. In view of this, in the embodiment, the first side wall 22 of the drive layer 2 at the first opening 21 has at least one step P, and the step surface F2 of the step P is gentle, so that the flow of the black optical adhesive can be slowed down, the black optical adhesive stops flowing when flowing to the step surface, and then the contact between the black optical adhesive and the base 1 can be avoided; therefore, the peeling phenomenon of the first light-shielding layer 3 can be avoided while the light-shielding effect is improved, so that the quality of the array substrate is ensured.

Referring to FIG. 2, it is to be noted that the first light-shielding layer 3 may extend to the step surface F2 of the first side wall 22 or may extend to the inclined surface F1 on one side of the step surface F2 away from the base 1, which is not limited in the embodiment of the present disclosure. As shown in FIG. 2, the first light-shielding layer 3 is in contact with the step P and ends on the step surface F2 of the step P, but the first light-shielding layer 3 is not in contact with the base 1, so that the peeling phenomenon of the first light-shielding layer 3 can be avoided while a good light-shielding effect is ensured.

It is to be noted that FIG. 2 only shows the example where the first side wall 22 has one step P. In other embodiments, the first side wall 22 may have two or more steps, so that the flow of the black optical adhesive can be slowed down several times, and then the black optical adhesive ends on the step surface of a certain step; therefore, the risk of the first light-shielding layer 3 coming into contact with the base 1 is further reduced, and the peeling phenomenon of the first light-shielding layer is further avoided.

It is to be further noted that those skilled in the art may use any technical means to achieve that the first side wall has at least one step, which is not limited in the embodiment of the present disclosure.

In summary, according to the array substrate configured in the embodiment of the present disclosure, the drive layer includes the first side wall having at least one step at the first opening, so that the first light-shielding layer can extend to the first side wall, the first light-shielding layer can end on the step surface of the first side wall, and the contact between the first light-shielding layer and the base is avoided; therefore, the peeling phenomenon of the first light-shielding layer can be avoided while the light-shielding effect is improved, and thus the quality of the array substrate is ensured.

Figure 3:
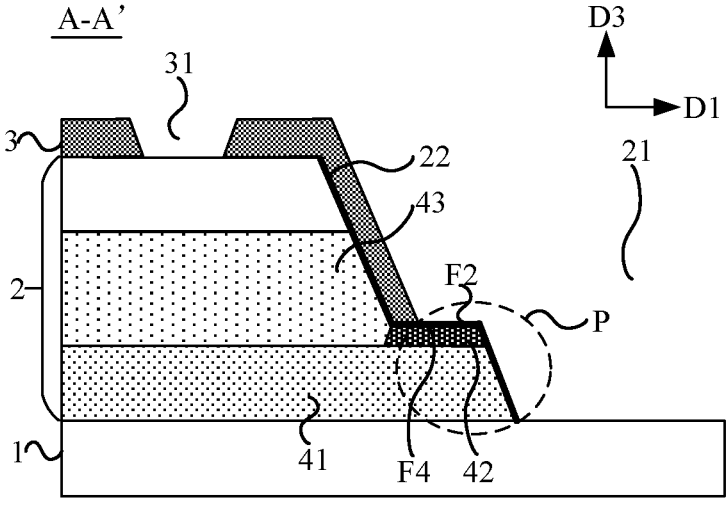
FIG. 3 is another sectional view of the array substrate taken along a section line A-A' in FIG. 1.

Based on the preceding embodiments, FIG. 3 is another sectional view of the array substrate taken along a section line A-A' in FIG. 1. As shown in FIG. 3, optionally, the drive layer 2 includes a first film layer 41 and a barrier structure 42 which are in contact with each other, the first film layer 41 is located between the barrier structure 42 and the base 1, and an upper surface F4 of the barrier structure 42 includes a step surface F2 of the step P.

The first film layer 41 may be understood as an insulating layer between the barrier structure 42 and the base 1, and the first film layer 41 at the region where the first opening 21 is provided needs to be removed. It is to be noted that if multiple insulating layers are included between the barrier structure 42 and the base 1, the first film layer 41 may be understood as an integral part composed of the multiple insulating layers, or may be understood as a single insulating layer or several continuous insulating layers, of the multiple insulating layers, which are in contact with the barrier structure 42.

Exemplarily, the first film layer 41 at the first opening 21 may be removed through the etching method. In the embodiment, the barrier structure 42 is used for blocking an etching substance (gas/liquid) etching part of the first film layer 41 which is covered by the barrier structure 42 when the first opening 21 is processed, so that the step surface F2 of the step P can be formed by at least part of the upper surface F4 of the barrier structure 42, that is, the upper surface F4 of the barrier structure 42 includes the step surface F2 of the step P.

As shown in FIG. 3, the barrier structure 42 and the first film layer 41 are aligned with each other at the first side wall 22. Specifically, due to the blocking effect of the barrier structure 42 on the etching substance, the barrier structure 42 and the side wall of the first film layer 41 towards the interior of the first opening 21 are located on the same inclined surface, that is, the etching gas etches part of the first film layer 41 which is not covered by the barrier structure 42 in the region where the first opening 21 is provided, so that the end position of the first film layer 41 can be defined by the barrier structure 42, and thus at least part of the upper surface of the barrier structure 42 forms the step surface of the step P.

It is to be noted that the number of layers of the barrier structure 42 may be determined according to the number of steps, which is not limited in the embodiment of the present disclosure. FIG. 3 only shows the example where one layer of barrier structure 42 is disposed on part of the drive layer 2.

Optionally, the material of the barrier structure 42 is different from the material of the first film layer 41. The same etching substance has different etch rates for different materials. In the embodiment, a material (for example, a material having a lower etch rate) different from the material of the first film layer 41 is selected to form the barrier structure 42. In the etching process, when etching reaches the film layer where the barrier structure 42 is located, since the etch rate by the etching substance for the region covered by the barrier structure 42 is less than the etch rate by the etching substance for the region not covered by the barrier structure 42, the barrier structure 42 can block the etching substance etching part of the first film layer 41 which is covered by the barrier structure 42, and part of the first film layer 41 which is not covered by the barrier structure 42 in the region where the first opening 21 is provided is etched; therefore, at least part of the upper surface F4 of the barrier structure 42 forms the step surface F2 of the step P. The process of this solution is less difficult to achieve; moreover, the barrier structure 42 is disposed, so that the end position of the first film layer 41 can be adjusted relatively precisely, which is conducive to ensuring the processing precision of the first opening 21.

Optionally, the material of the barrier structure 42 includes metal or a semiconductor, and the material of the first film layer 41 includes an inorganic material. At this time, the first film layer 41 may be understood as an inorganic insulating layer between the barrier structure 42 and the base 1. Specifically, the dry etching method may be used for processing an opening in the inorganic film layer. The etching gas used for etching the inorganic material etches the metal or the semiconductor at a relatively low rate; in view of this, the barrier structure 42 is made of metal or a semiconductor material, so that etching by the etching gas for part of the first film layer 41 which is covered by the barrier structure 42 can be blocked by the barrier structure 42 during the process of processing the first opening 21, and thus a step can be formed.

As shown in FIG. 3, optionally, the drive layer 2 further includes a second film layer 43, and the second film layer 43 is in contact with the first film layer 41 and extends to the first side wall 22; the first film layer 41 is located between the second film layer 43 and the base 1; and the material of the first film layer 41 and the material of the second film layer 43 are both inorganic materials.

The second film layer 43 may be understood as an inorganic insulating layer on one side of the first film layer 41 away from the base 1, and the second film layer 43 includes at least one inorganic insulating layer in contact with the first film layer 41. It is to be noted that when the side of the first film layer 41 away from the base 1 includes multiple inorganic insulating layers, the second film layer 43 may be understood as an integral part composed of the multiple inorganic insulating layers, or may be understood as an inorganic insulating layer or multiple continuously-disposed inorganic insulating layers, of the multiple inorganic insulating layers, which are in contact with the first film layer 41.

Referring to FIG. 3, the material of the first film layer 41 and the material of the second film layer 43 are both inorganic materials, and the material of the barrier structure 42 is metal or a semiconductor. The etching gas used for etching the inorganic material etches the metal or the semiconductor at a relatively low rate; therefore, after the second film layer 43 is etched to expose the barrier structure 42, the barrier structure can block etching by the etching gas for part of the first film layer 41 which is covered by the barrier structure 42, so that the etching gas etches part of the first film layer 42 which is not covered by the barrier structure 42 in the region where in the first opening 21 is provided. Thus, in the same etching process, different film layer end positions can be formed for the first film layer 41 and the second film layer 43 which are both made of inorganic materials so that a step structure is formed, that is, the end position of the first film layer 41 is adjusted by the barrier structure 42, and then the step surface F2 of the step P is formed by at least part of the upper surface F4 of the barrier structure 42; in this manner, the process is simple and the processing precision of the first opening 21 can be controlled relatively accurately.

The size of the opening of the second film layer 43 may be an etching opening size preset when the first film layer 41 and the second film layer 43 are etched. The barrier structure 42 is disposed and adjusts the size of the etched opening of the first film layer 41, so that the size of the opening of the first film layer 41 is less than the size of the opening of the second film layer 43, and thus a step structure is formed.

Exemplarily, as shown in FIG. 3, optionally, the second film layer 43 is in contact with the barrier structure 42. At this time, after the second film layer 43 in the region where the first opening 21 is provided is removed, the entire barrier structure 42 can be exposed, and the upper surface F4 of the barrier structure 42 is the step surface F2 of the step P, so that the step length between two adjacent inclined surfaces is ensured, and thus the first light-shielding layer 3 ends on the step surface of the step P.

Figure 4:
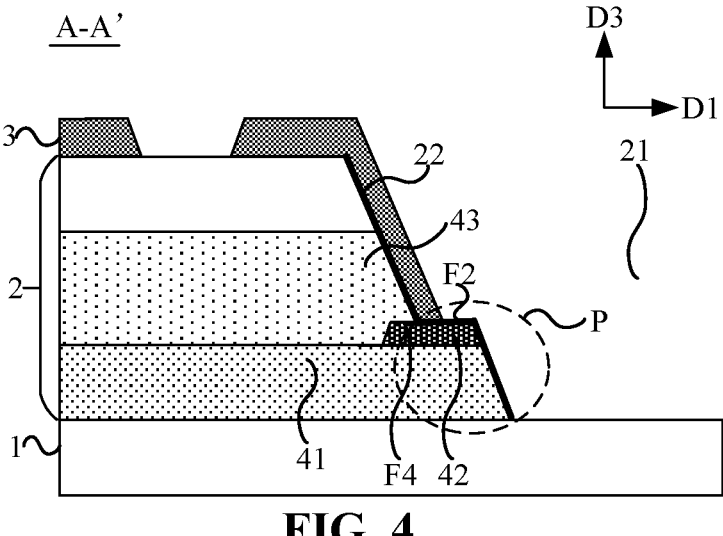
FIG. 4 is another sectional view of the array substrate taken along a section line A-A' in FIG. 1.

Of course, the arrangement manner shown in FIG. 3 is merely illustrative and not limiting. FIG. 4 is another sectional view of the array substrate taken along a section line A-A' in FIG. 1. As shown in FIG. 4, in other embodiments, optionally, the second film layer 43 covers at least part of the barrier structure 42. At this time, after the second film layer 43 in the region where the first opening 21 is provided is removed, part of the barrier structure 42 can be exposed, and part of the upper surface F4 of the barrier structure 42 which is not covered by the second film layer 43 is the step surface F2 of the step P, so that the first light-shielding layer 3 can end on the step surface of the step P and the contact between the first light-shielding layer 3 and the base 1 is avoided; in this manner, the peeling phenomenon of the first light-shielding layer 3 is avoided while the light-shielding effect is improved, and thus the quality of the array substrate is ensured.

Optionally, the barrier structure 42 is insulated from other electrical components of the drive layer 2. Exemplarily, the barrier structure 42 is insulated from other electrical components of the drive layer such as the preceding pixel driving circuits and signal lines. Both the metal and the semiconductor material have electrical conductivity. The barrier structure is set to be mutually insulated from other electrical components of the driver layer, so that the impact on the normal operation of the electrical components can be avoided, and thus the normal display effect of the display panel can be ensured. The arrangement manner of the barrier structure is further described below in conjunction with the specific structure of the drive layer.

Figure 5:
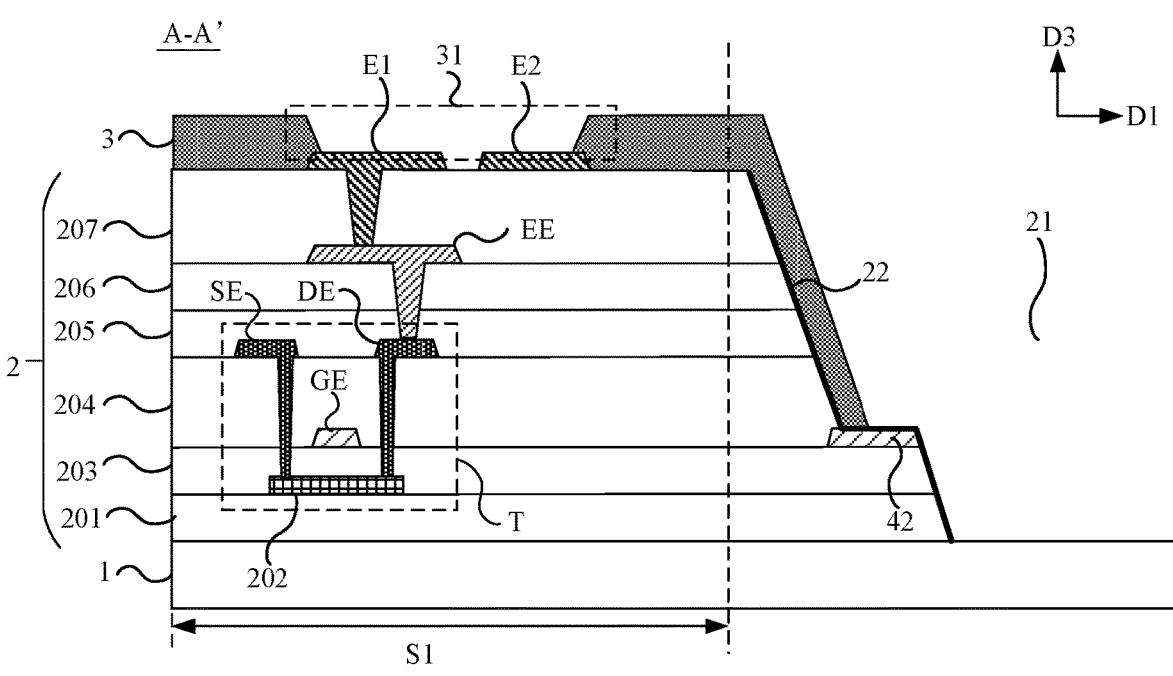
FIG. 5 is another sectional view of the array substrate taken along a section line A-A' in FIG. 1.

FIG. 5 is another sectional view of the array substrate taken along a section line A-A' in FIG. 1. As shown in FIG. 5, in the embodiment, the drive layer 2 further includes a thin-film transistor T, and the thin-film transistor T includes an active layer 202, a gate GE, a source SE and a drain DE. Optionally, the barrier structure 42 is disposed in the same layer as at least one of the active layer 202, the gate GE, the source SE or the drain DE.

Specifically, in the drive layer, the thin-film transistor may be applied to various circuits such as a pixel driving circuit, a gate driver circuit and a multiplexing circuit. Since the first opening 21 is generally configured in the display region, the thin-film transistor T shown in FIG. may be understood as a thin-film transistor in a pixel driving circuit; and the arrangement manner of the barrier structure is subsequently described based on the thin-film transistor in the pixel driving circuit.

Referring to FIG. 5, a thin-film transistor T mainly includes an active layer 202, a gate GE, a source SE and a drain DE. The gate GE is disposed insulated from the active layer 202, the source SE may be disposed in the same layer as the drain DE, and via holes are configured in the insulating layer so that the source SE and the drain DE separately form an ohmic contact with the active layer 202.

The gate, the source and the drain of the thin-film transistor may be made of a metal material, or may be made of other conductive materials (such as metal oxide). The active layer is made of a semiconductor material, and common materials of the active layer include polysilicon (such as low-temperature polysilicon (LTPS)) and oxide semiconductors (such as indium gallium zinc oxide (IGZO)). In the embodiment, the barrier structure 42 is disposed in the same layer as at least one of the active layer 202, the gate GE, the source SE or the drain DE, so that the requirement for the etch rate of the barrier structure 42 can be satisfied, and additional film layers of the array substrate can be avoided, which is conducive to the thin design of the display panel.

Still referring to FIG. 5, optionally, the active layer 202 is located between the film layer where the gate GE is located and the base 1, and the gate GE is located between the film layer where the active layer 202 is located and the film layer where the source SE and the drain DE are located; and the barrier structure 42 is disposed in the same layer as the gate GE. Since the gate GE is relatively close to the base 1, the barrier structure 42 is disposed in the same layer as the gate GE, so that a good light-shielding effect can be achieved. Moreover, the thin-film transistor is sensitive to light, and if the active layer 202 is exposed to light, the threshold voltage of the thin-film transistor tends to shift. Since the gate GE is closer to the active layer 202 than the source SE and the drain DE, in the embodiment, the barrier structure 42 is disposed in the same layer as the gate GE, so that the light emitted to the active layer 202 can be effectively reduced, and the threshold shift phenomenon of the thin-film transistor can be improved, which is conducive to ensuring the driving capability of the pixel driving circuit.

As shown in FIG. 5, in the region where the pixel driving circuit is located, the driver layer 2 may include a buffer layer 201 (also an insulating layer), the active layer 202, a gate insulating layer 203, the film layer where the gate GE is located, an interlayer insulating layer 204, the film layer where the source SE and the drain DE are located, a passivation layer 205, a first planarization layer 206, the film layer where a transition electrode EE is located, a second planarization layer 207 and the film layer where a connection electrode E1 and a connection electrode E2 are located which are laminated in sequence and disposed on the base 1.

The connection electrode E1 and the connection electrode E2 are used for subsequent electrical connection with light-emitting elements. Exemplarily, the light-emitting elements may be micro light-emitting diodes, and the micro light-emitting diodes may be transported to the array substrate by means of mass transfer and electrically connected to the connection electrode E1 and the connection electrode E2 on the array substrate. Specifically, the connection electrode E1 and the connection electrode E2 may be configured to be electrically connected to an anode and a cathode of a micro light-emitting diode, respectively. As shown in FIG. 5, a second opening 31 is configured in the first light-shielding layer 3, and the second opening 31 exposes the connection electrode E1 and the connection electrode E2 for subsequent electrical connection between the light-emitting element and the connection electrode E1 and the connection electrode E2. The transition electrode EE is configured to electrically connect the thin-film transistor T and a connection electrode (such as E1) so that the light-emitting element is electrically connected to the pixel driving circuit.

The buffer layer 201, the gate insulating layer 203, the interlayer insulating layer 204 and the passivation layer 205 are generally made of inorganic materials, such as silicon oxide, silicon nitride or a laminated layer of silicon oxide and silicon nitride. The first planarization layer 206 and the second planarization layer 207 are generally made of organic materials, and the specific material may be a transparent optical adhesive, such as an acrylic-based organic material or an epoxy-based organic material.

Referring to FIG. 4 and FIG. 5, if the barrier structure 42 is disposed in the same layer as the gate GE, the preceding first film layer may specifically refer to the buffer layer 201 and the gate insulating layer 203, and the second film layer 43 may specifically refer to the interlayer insulating layer 204 and the passivation layer 205. Exemplarily, after the preparation of the passivation layer 205 and film layer structures below the passivation layer 205 is completed, the etching on the buffer layer 201, the gate insulating layer 203, the interlayer insulating layer 204 and the passivation layer 205 may be performed at one time by means of the dry etching method. Due to the presence of the barrier structure 42, end positions of the interlayer insulating layer 204 and the passivation layer 205 are different from end positions of the buffer layer 201 and the gate insulating layer 203, so that the step surface of the step can be formed by at least part of the upper surface of the barrier structure 42.

Moreover, for the etching on the first planarization layer 206 and the second planarization layer 207, since the transparent optical adhesive is a photosensitive material, a photolithography process may be used for patterning the first planarization layer 206 and the second planarization layer 207 after the preparation of corresponding film layers is completed. It is to be noted that the etching on the first film layer 41 and the second film layer 42 may be performed before the formation of film layers such as the first planarization layer 206 and the second planarization layer 207, or may be performed after the formation of film layers such as the first planarization layer 206 and the second planarization layer 207, which is not limited in the embodiment of the present disclosure and will be described in detail with reference to relevant embodiments of the preparation method.

Figure 6:
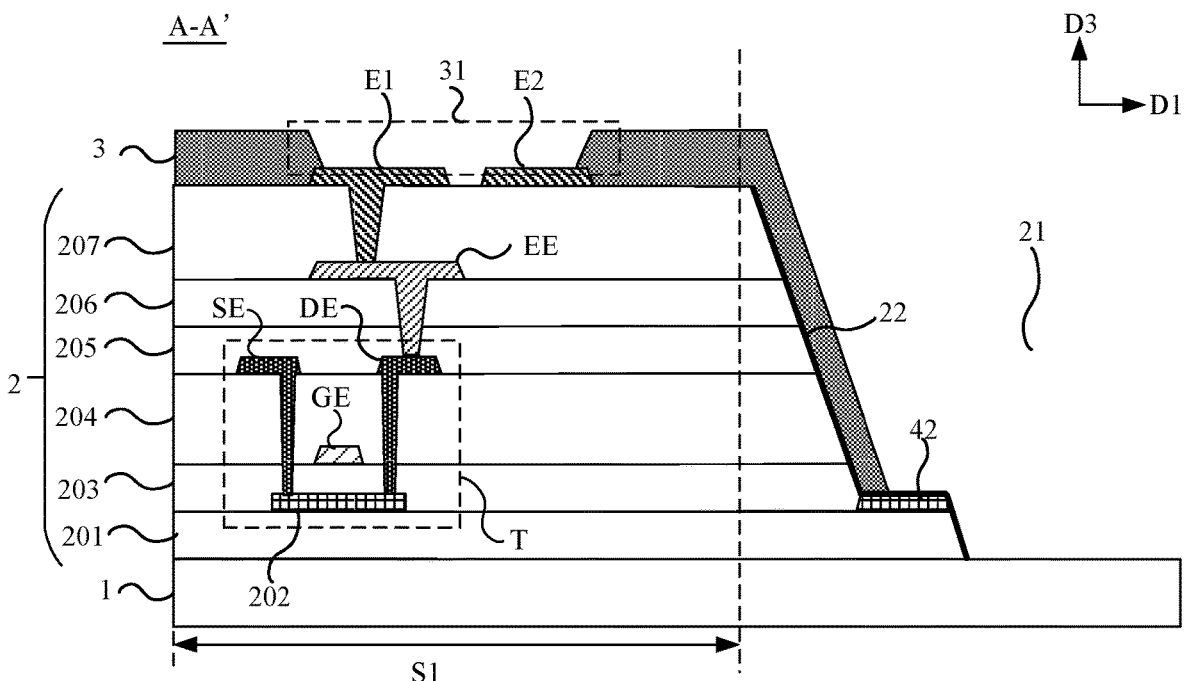
FIG. 6 is another sectional view of the array substrate taken along a section line A-A' in FIG. 1.

FIG. 6 is another sectional view of the array substrate taken along a section line A-A' in FIG. 1. FIG. 6 differs from FIG. 5 in that the barrier structure 42 is disposed in the same layer as the active layer 202 in FIG. 6. The active layer 202 is closer to the base 1 than the gate GE, and the etch rate by the etching gas for the active layer material is less than the etch rate by the etching gas for the inorganic insulating layer; therefore, the barrier structure 42 is disposed in the same layer as the active layer 202, so that the barrier structure 42 can be closer to the base 1, the first light-shielding layer 3 can extend to the barrier structure 42 which is closer to the base 1 and cover more regions of the first side wall 22, and thus the light-shielding effect can be further improved; moreover, external ambient light or light emitted by surrounding light-emitting elements are avoided radiating from the first side wall 22 to the active layer 202, so that the threshold shift phenomenon of the thin-film transistor is improved.

Referring to FIG. 4 and FIG. 6, if the barrier structure 42 is disposed in the same layer as the active layer 202, the preceding first film layer may specifically refer to the buffer layer 201, and the second film layer 42 may specifically refer to the gate insulating layer 203, the interlayer insulating layer 204 and the passivation layer 205.

It is to be noted that FIG. 5 and FIG. 6 only show the example where the gate GE is located on one side of the active layer 202 away from the base 1. In other embodiments, optionally, the gate GE may be located between the active layer 202 and the base 1 and is disposed insulated from the active layer.

Figure 7:
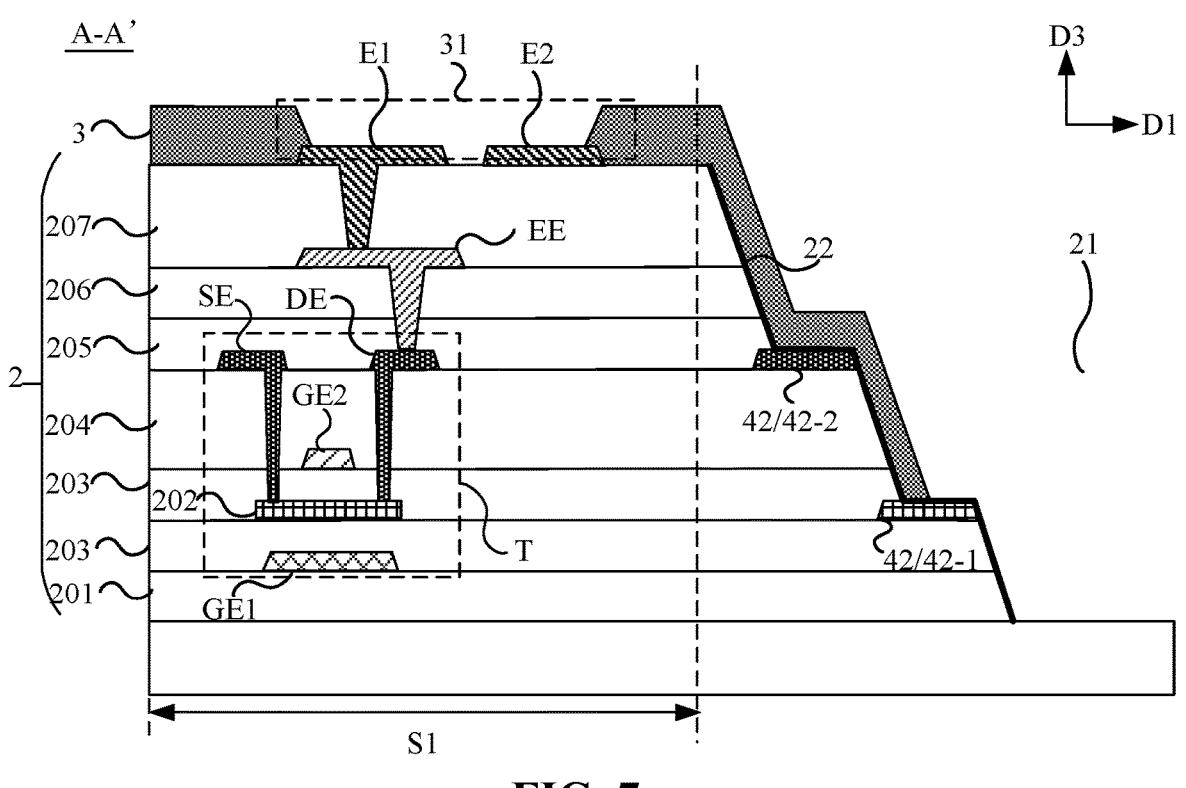
FIG. 7 is another sectional view of the array substrate taken along a section line A-A' in FIG. 1.

In addition, FIG. 7 is another sectional view of the array substrate taken along a section line A-A' in FIG. 1. As shown in FIG. 7, in an embodiment, optionally, the thin-film transistor T includes a bottom gate GE1 and a top gate GE2 located at two opposite sides of the active layer 202, and a gate insulating layer 203 is configured between the bottom gate GE1 and the active layer 202 and a gate insulating layer 203 is configured between the top gate GE2 and the active layer 202. At this time, the thin-film transistor T is a double-gate transistor with the advantage of a small leakage current. Exemplarily, FIG. 7 only shows the example where the drive layer 2 includes two layers of barriers structures 42, one layer of barrier structure 42-2 is disposed in the same layer as the source SE, and the other layer of barrier structure 42-1 is disposed in the same layer as the active layer 202. Other optional arrangement manners are not listed here.

For the implementation shown in FIG. 7, the buffer layer 201 and the gate insulating layer 203 between the bottom gate GE1 and the active layer 202 may be understood as the first film layer corresponding to the barrier structure 42-1, the interlayer insulating layer 204 and the gate insulating layer 203 between the top gate GE2 and the active layer 202 may be understood as the second film layer corresponding to the barrier structure 42-1 or may be understood as the first film layer corresponding to the barrier structure 42-2, and the passivation layer 205 may be understood as the second film layer corresponding to the barrier structure 42-2.

Figure 8:
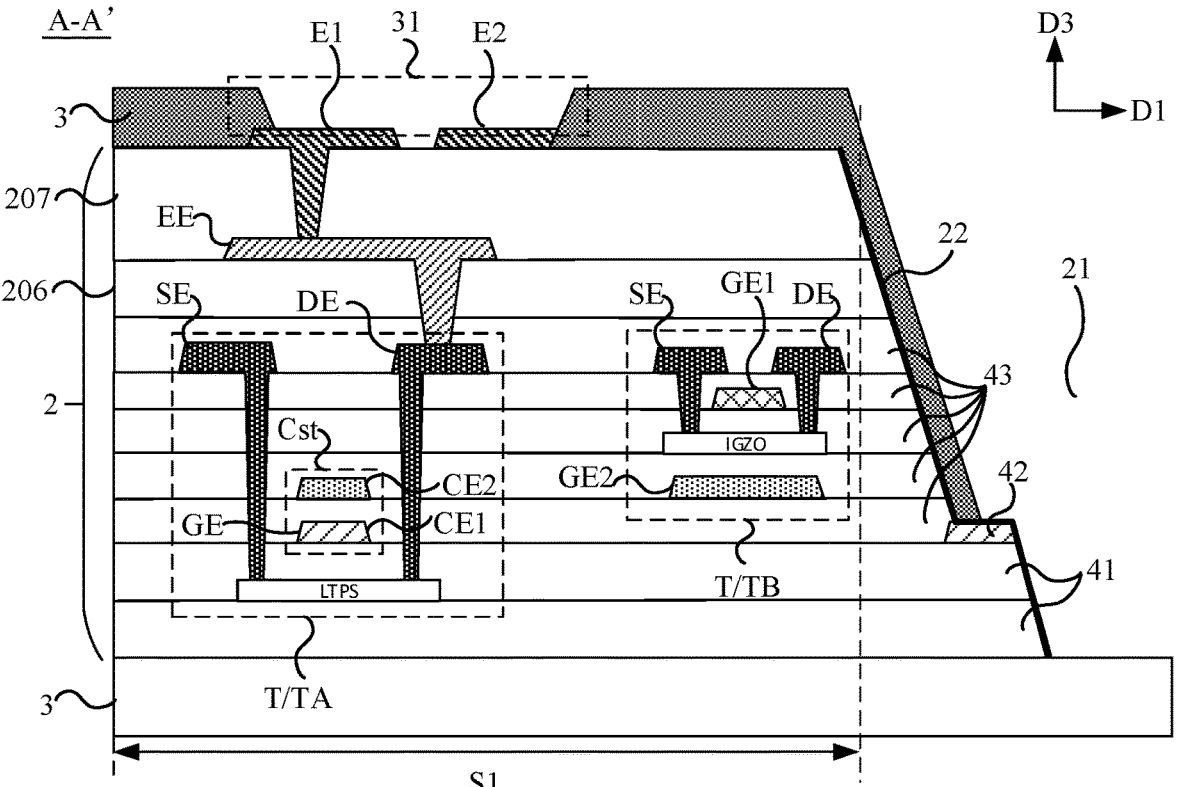
FIG. 8 is another sectional view of the array substrate taken along a section line A-A' in FIG. 1.

Moreover, FIG. 8 is another sectional view of the array substrate taken along a section line A-A' in FIG. 1. As shown in FIG. 8, in an embodiment, optionally, the thin-film transistor T in the pixel driving circuit includes a first type thin-film transistor TA and a second type thin-film transistor TB; the first type thin-film transistor TA includes a polysilicon (such as LTPS) active layer, and the second type thin-film transistor TB includes an oxide semiconductor (such as IGZO) active layer. The LTPS transistor has advantages of a high switching speed, high carrier mobility and low power consumption, while the IGZO transistor has advantages of a simple preparation process and a low leakage current. The pixel driving circuit includes both the first type thin-film transistor TA and the second type thin-film transistor TB, so that a low-temperature polycrystalline oxide (LTPO) circuit is formed; therefore, the advantages of different transistors are utilized, and excellent performance and high drive efficiency of the pixel driving circuit are ensured. In the embodiment, the barrier structure 42 may be disposed in the same layer as at least one of film layers such as the source, the drain, the active layer and the gate in the two types of thin-film transistors. FIG. 8 only shows the example where the barrier structure 42 is disposed in the same layer as the gate GE of the first type of the thin-film transistor TA, and other optional arrangement manners are not listed here. In addition, based on the preceding explanation, the inorganic insulating layer between the barrier structure 42 and the first planarization layer 206 may be understood as the second film layer 43, and the inorganic insulating layer between the barrier structure 42 and the base 1 may be understood as the first film layer 41.

Figure 9:
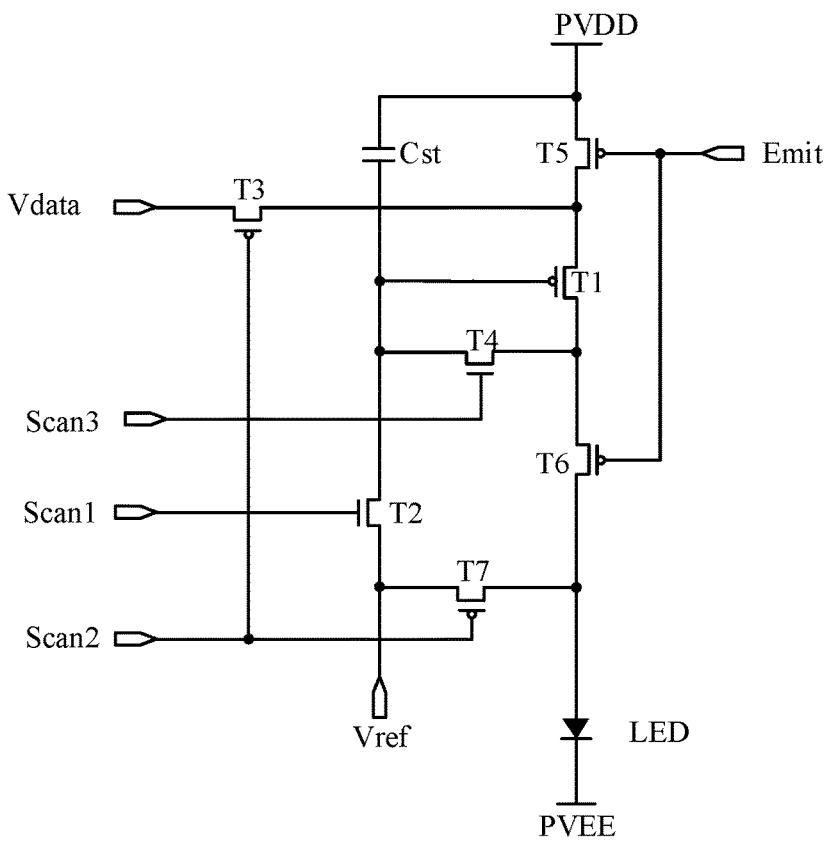
FIG. 9 is a circuit diagram of a pixel driving circuit according to an embodiment of the present disclosure.

Exemplarily, FIG. 9 is a circuit diagram of a pixel driving circuit according to an embodiment of the present disclosure. As shown in FIG. 9, the pixel driving circuit includes a drive transistor T1, an initialization transistor T2, a data write transistor T3, a threshold compensation transistor T4, a first light emission control transistor T5, a second light emission control transistor T6, a reset transistor T7 and a capacitor Cst, which can form a 7T1C (T denotes the thin-film transistor, and C denotes the capacitor) pixel circuit. Optionally, the drive transistor T1, the data write transistor T3, the first light emission control transistor T5, the second light emission control transistor T6 and the reset transistor T7 may be the first type thin-film transistors TA such as LTPS transistors so that the power consumption of the pixel circuit can be reduced and the response time of the pixel circuit can be shortened; moreover, the initialization transistor T2 and the threshold compensation transistor T4 may be second type thin-film transistors TB such as IGZO transistors so that the leakage current of the initialization transistor T2 and the threshold compensation transistor T4 can be reduced, the impact of the leakage current of the initialization transistor T2 and the threshold compensation transistor T4 on a gate potential of the drive transistor T1 can be reduced, and thus the performance of the pixel circuit can be further optimized.

Figure 10:
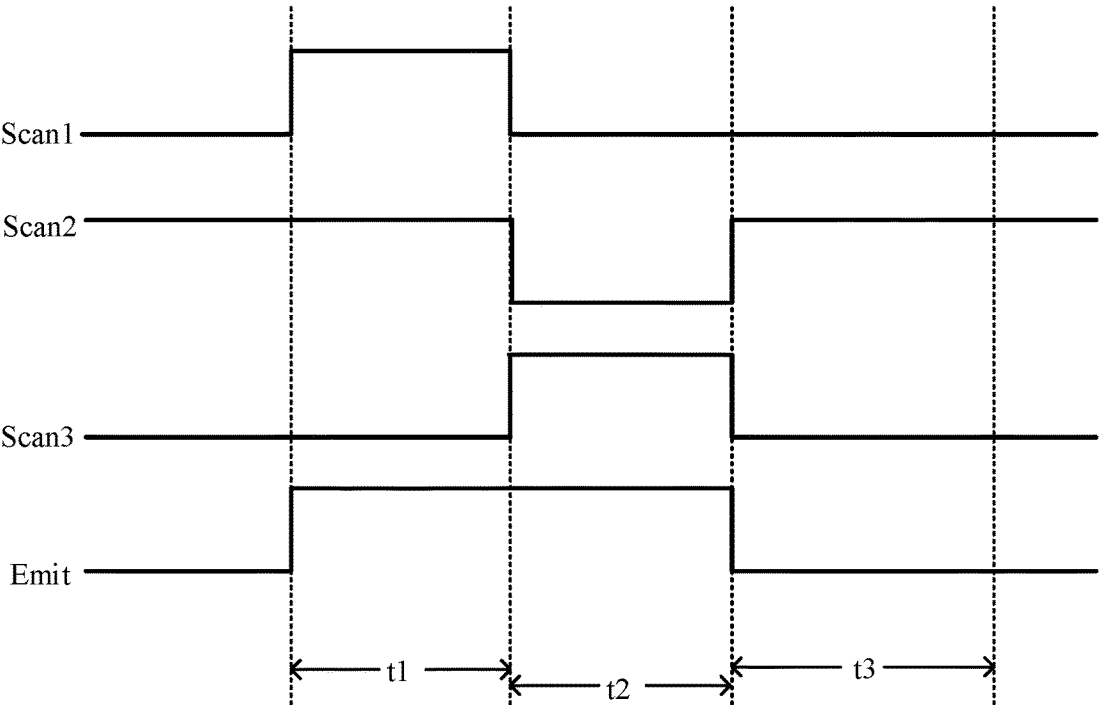
FIG. 10 is a driving timing graph of the pixel driving circuit shown in FIG. 9.

FIG. 10 is a driving timing graph of the pixel driving circuit shown in FIG. 9. Referring to FIG. 9 and FIG. 10, the driving process of the pixel driving circuit includes an initialization stage t1, a data write stage t2 and a light emission stage t3. Specifically, in the initialization stage t1, the initialization transistor T2 is turned on under the control of a first scan control signal sent by a first scan control signal terminal Scan1, so that an initialization signal of an initialization signal terminal Vref is written into the gate of the drive transistor T1, and then the gate of the drive transistor is initialized. In the data write stage t2, the data write transistor T3 is turned on under the control of a second scan control signal sent by a second scan control signal terminal Scan2, the threshold compensation transistor T4 is turned on under the control of a third scan control signal sent by a third scan control signal terminal Scan3. At the same time, the drive transistor T1 is turned on as a gate-source voltage satisfies a turned-on condition, so that a data signal of a data signal terminal Vdata is written into the gate of the drive transistor T1 through the data write transistor T3, and at the same time, a threshold voltage of the drive transistor T1 is compensated for the gate of the drive transistor T1 through the threshold compensation transistor T4. In addition, in the data write stage t2, the reset transistor T7 may be turned on under the control of the second scan control signal sent by the second scan control signal terminal Scan2, write the initialization signal of the initialization signal terminal Vref into an anode of a light-emitting element (such as a LED), and reset the voltage of the anode of the light-emitting element. In the light emission stage t3, the first light emission control transistor T5 and the second light emission control transistor T6 are turned on under the control of a light emission control signal of a light emission control signal terminal Emit; and the capacitor Cst stores the gate potential of the drive transistor T1, so that the drive transistor T1 generates a drive current based on the gate potential and a potential of a first power supply signal terminal PVDD to drive the LED to emit light. In FIG. 10, PVEE is a second power signal terminal, and a potential of the second power signal terminal PVEE is less than the potential of the first power signal terminal PVDD.

Figure 11:
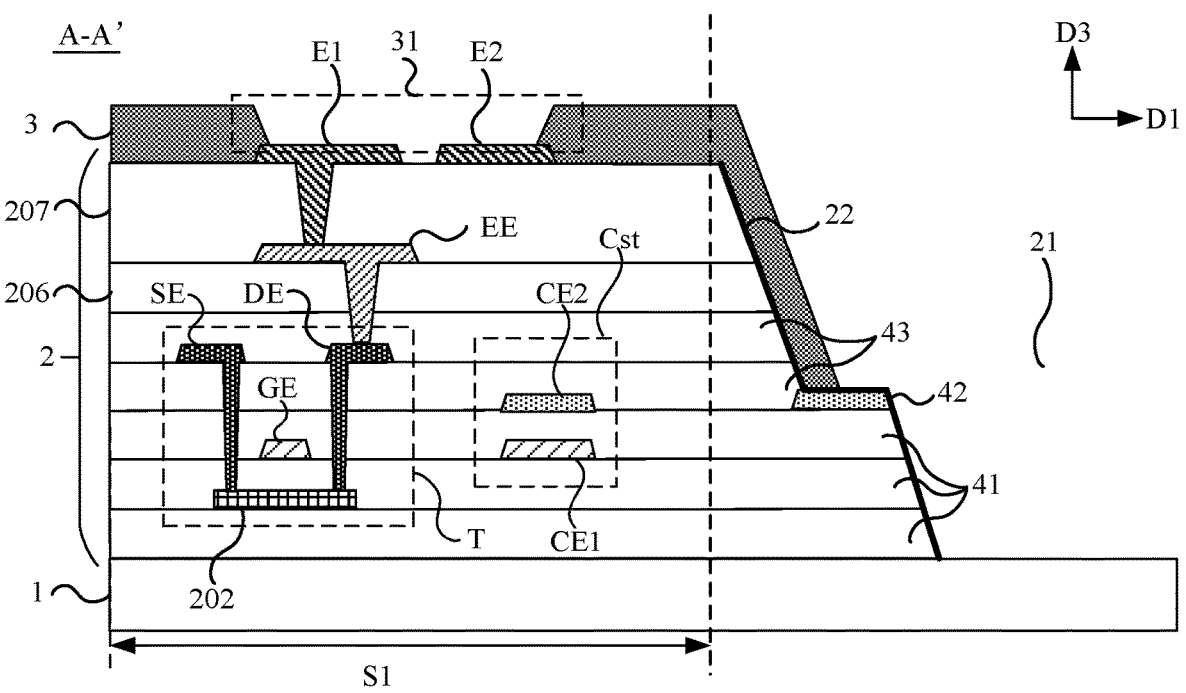
FIG. 11 is another sectional view of the array substrate taken along a section line A-A' in FIG. 1.

FIG. 11 is another sectional view of the array substrate taken along a section line A-A' in FIG. 1. As shown in FIG. 11, the drive layer 2 further includes a thin-film transistor T and a capacitor Cst. The thin-film transistor T includes an active layer 202, a gate GE, a source SE and a drain DE, and the capacitor Cst includes a first capacitor plate CE1 and a second capacitor plate CE2 which are disposed opposite to each other. Optionally, the barrier structure 42 is disposed in the same layer as at least one of the active layer 202, the gate GE, the source SE, the drain DE, the first capacitor plate CE1 or the second capacitor plate CE2.

Specifically, if the drive layer 2 includes one layer of barrier structure 42, the barrier structure 42 may be disposed in the same layer as one of the active layer 202, the gate GE, the source SE, the drain DE, the first capacitor plate CE1 or the second capacitor plate CE2. If the drive layer 2 includes two or more layers of barrier structures 42, the drive layer 2 including two layers of barrier structures 42 is taken as an example, and the two layers of barrier structures 42 may be disposed in same layers as two, which are disposed in different layers, of the active layer 202, the gate GE, the source SE, the drain DE, the first capacitor plate CE1 and the second capacitor plate CE2, respectively. Exemplarily, FIG. 11 shows the example where the first capacitor plate CE1 is disposed in the same layer as the gate GE, the source SE is disposed in the same layer as the drain DE, and the drive layer 2 includes one layer of barrier structure 42 and the barrier structure 42 is disposed in the same layer as the second capacitor plate CE2; and other optional arrangement manners are not listed here. It is to be understood that the closer the barrier structure 42 is to the base 1, the better the light shielding effect is of the first light-shielding layer 3 on the side wall position of the drive layer 2, and the more conducive it is to improving the threshold shift of the thin-film transistor.

It is to be noted that FIG. 11 only shows the example where the active layer 202 of the thin-film transistor is located between the film layer where the gate GE is located and the base 1, and the gate GE is located between the film layer where the active layer 202 is located and the film layer where the source SE and the drain DE are located; other types of thin-film transistors may be selectively disposed with reference to the preceding description, which is not limited in the embodiment of the present disclosure.

Figure 12:
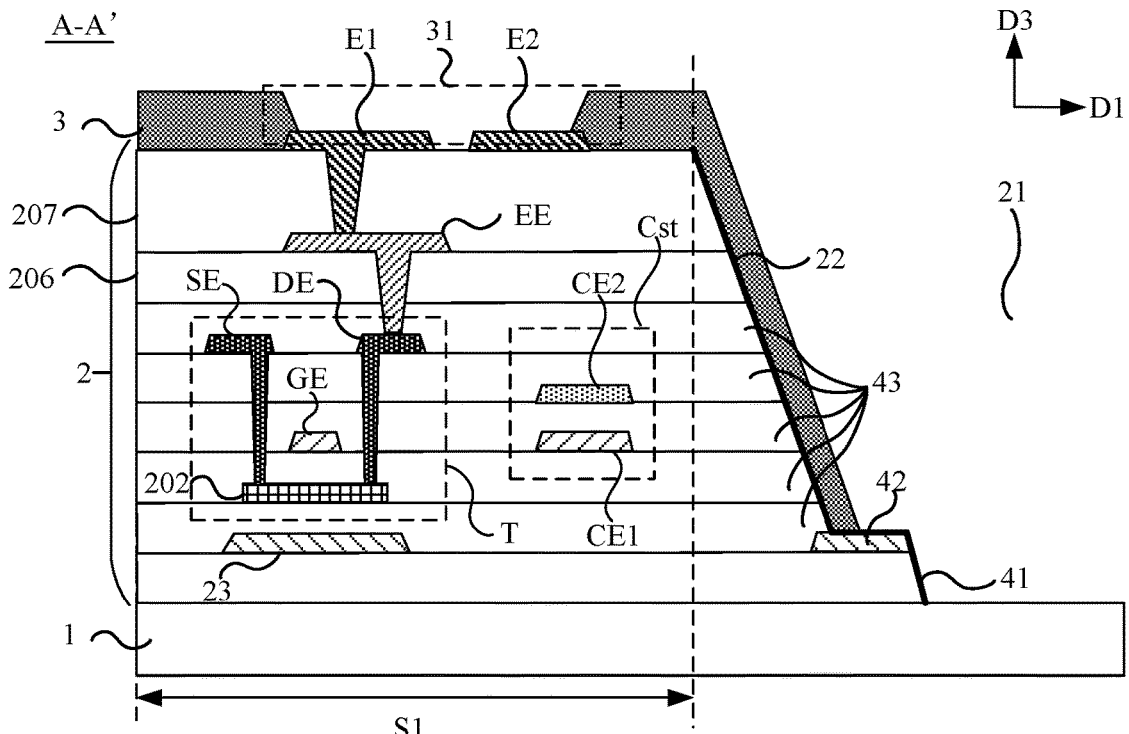
FIG. 12 is another sectional view of the array substrate taken along a section line A-A' in FIG. 1.

FIG. 12 is another sectional view of the array substrate taken along a section line A-A' in FIG. 1. As shown in FIG. 12, optionally, the drive layer 2 further includes a thin-film transistor T and a light-shielding portion 23, the thin-film transistor T includes an active layer 202, and the light-shielding portion 23 is located between the active layer 202 and the base 1 and overlaps the active layer 202. The barrier structure 42 is disposed in the same layer as the light-shielding portion 23.

The light-shielding portion 23 overlapping the active layer 202 specifically refers to that the light-shielding portion 23 overlaps the active layer 202 along a thickness direction (direction D3) of the array substrate. The light-shielding portion 23 is disposed between the active layer 202 and the base 1, so that at least part of light radiating from the base 1 to the active layer 202 can be shielded against by the light-shielding layer 23, and thus the threshold shift of the thin-film transistor can be improved.

If the drive layer 2 includes the light-shielding portion 23, the barrier structure 42 may be disposed in the same layer as the light-shielding portion 23. In this manner, the light-shielding portion 23 is closer to the base 1 than the active layer 202, so that the first light-shielding layer 3 can extend to the barrier structure 42 which is closer to the base 1 than the active layer 202 and cover more regions of the first side wall 22, and the light shielding effect of the first light-shielding layer 3 is improved while the peeling phenomenon of the first light-shielding layer 3 is avoided. Therefore, the light radiating from the first side wall 22 to the active layer 202 is better shielded, and thus the threshold shift of the thin-film transistor is improved. Exemplarily, the light-shielding portion 23 may be made of a metal material, and thus the barrier structure 42 and the light-shielding portion 23 can be prepared in the same process, simplifying the preparation process.

Figure 13:
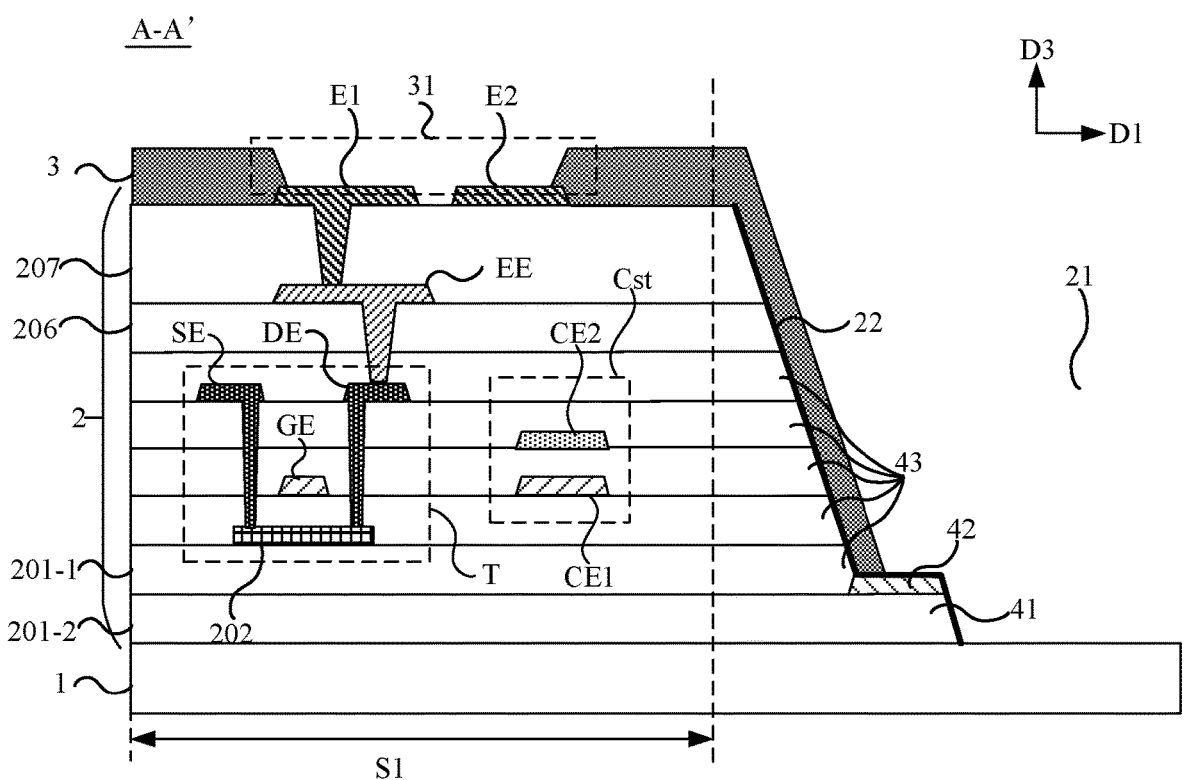
FIG. 13 is another sectional view of the array substrate taken along a section line A-A' in FIG. 1.

Of course, the light-shielding portion may be disposed or not according to actual requirements. In other embodiments, even if no light-shielding portion is disposed on one side of the active layer 202 close to the base 1, the barrier structure 42 may be disposed in a film layer on the side of the active layer 202 close to the base 1, so that the first light-shielding layer 3 can better perform light shielding on the active layer of the thin-film transistor, and the threshold shift of the thin-film transistor can be improved. Exemplarily, FIG. 13 is another sectional view of the array substrate taken along a section line A-A' in FIG. 1. As shown in FIG. 13, the drive layer 2 further includes a thin-film transistor T, and the thin-film transistor T includes an active layer 202; the film layer where the barrier structure 42 is located is disposed between the film layer where the active layer 202 is located and the base 1. FIG. 13 differs from FIG. 12 mainly in that no light-shielding portion is disposed in FIG. 13, but a film layer (such as a metal layer) is added between the active layer 202 and the base 1 to form the barrier structure 42. In this manner, the barrier structure 42 can also be closer to the base 1 than the active layer 202, so that the first light-shielding layer 3 can cover more regions of the first side wall 22, the light radiating from the first side wall 22 to the active layer 202 can be better shielded, and thus the threshold shift of the thin-film transistor can be improved.

Still referring to FIG. 13, optionally, the drive layer 2 further includes a first buffer layer 201-1, and the first buffer layer 201-1 is located between the active layer 202 and the base 1, and the film layer where the barrier structure 42 is located is disposed between the first buffer layer 201-1 and the base 1. The first buffer layer 201-1 may be understood as a buffer layer located between the active layer 202 and the base 1 and in contact with the active layer 202. The film layer where the barrier structure 42 is located is disposed between the first buffer layer 201-1 and the base 1, so that the barrier structure 42 can be closer to the base 1 than the active layer 202, then the first light-shielding layer 3 can cover more regions of the first side wall, the light radiating from the first side wall 22 to the active layer 202 can be better shielded, and thus the threshold shift of the thin-film transistor can be improved.

Further, Still referring to FIG. 13, optionally, the drive layer 2 further includes a second buffer layer 201-2, and the second buffer layer 201-2 is located between the barrier structure 42 and the base 1. As described above, the material of the buffer layer may be an inorganic material, and the material of the barrier structure 42 may be a metal material, and the film adhesion between the metal material and the inorganic material is stronger than the film adhesion between the metal material and the glass. In the embodiment, the second buffer layer 201-2 is disposed between the barrier structure 42 and the base 1, so that the direct contact between the barrier structure 42 and the base 1 can be avoided, and thus the peeling phenomenon of the barrier structure 42 can be avoided. Of course, this arrangement manner is not limiting. In other embodiments, if the material is selected such that the film adhesion between the barrier structure 42 and the base 1 is better and the peeling risk of the barrier structure 42 is relatively low, the barrier structure 42 may be in direct contact with the base 1 as another sectional view of the array substrate taken along a section line A-A' in FIG. 1 shown in FIG. 14, so that the excessive number of film layers of the array substrate can be avoided, which is conducive to the thin design of the display panel.

As shown in FIG. 1, optionally, the array substrate 100 includes a circuit region S1 and a line region S2. The drive layer includes a thin-film transistor and multiple signal lines, the thin-film transistor is located in the circuit region S1, and the multiple signal lines are located in the line region S2. The circuit region S1 and the region where the first opening 21 is located are adjacently configured along a first direction D1, and the line region S2 and the region where the first opening 21 is located are adjacently configured along a second direction D2, where the first direction D1 and the second direction D2 intersect and are both parallel to the plane where the base is located.

Specifically, pixel driving circuits are disposed in the circuit region S1 of the array substrate, and signal lines are disposed in the line region S2 of the array substrate. The signal lines are configured to transmit required electrical signals to the pixel circuits. In the embodiment, the circuit region S1 and the region where the first opening 21 is located are adjacently configured along the first direction D1, the line region S2 and the region where the first opening 21 is located are adjacently configured along the second direction D2, and the first direction D1 and the second direction D2 are two directions intersecting with each other, so that the signal lines of the line region S1 extend along the first direction D1, which is conducive to the signal lines of the line region S2 being electrically connected to the pixel driving circuits of various circuit regions S1 to transmit electrical signals to the pixel driving circuits. Moreover, the layout of circuit regions and line regions in the array substrate is more regular, and the implementation difficulty posed by the arrangement of the first opening 21 to the electrical connection between the pixel driving circuits and the signal lines is reduced.

Optionally, the first direction D1 and the second direction D2 may be parallel to extension directions of scan lines and data lines, respectively. For example, the first direction D1 is parallel to the extension direction of the scan lines, and the second direction D2 is parallel to the extension direction of the data lines; alternatively, the first direction D1 is parallel to the extension direction of the data lines, and the second direction D2 is parallel to the extension direction of the scan lines. Exemplarily, FIG. 1 only shows the example where the first direction D1 is parallel to the extension direction of a data line DL, and the second direction D2 is parallel to the extension direction of a scan line GL. At this time, the data line DL is located in the line region S2 and can transmit a data signal to the pixel driving circuit of each circuit region S1. In other embodiments, optionally, the first direction is parallel to the extension direction of the scan line GL, and the second direction is parallel to the extension direction of the data line DL. At this time, the scan line GL is located in the line region so as to transmit a data signal to the pixel driving circuit of each circuit region.

It is to be noted that in the embodiment, signal lines located in the line region S2 specifically refer to signal lines extending along a long side extension direction (that is, the first direction D1) of the line region S2, and such signal lines are mainly located in the line region S2 and certainly also have part passing through the circuit region S1, so that such signal lines may be understood as signal lines located in the line region S2. In addition, the circuit region S1 may also have signal lines. Signal lines extending along a long side extension direction (that is, the second direction D2) of the circuit region S1 and only passing through the line region S2 may be understood as signal lines located in the circuit region S1. Exemplarily, referring to FIG. 1, the first direction D1 being parallel to the extension direction of the data line DL and the second direction D2 being parallel to the extension direction of the scan line GL is taken as an example. The data line DL extending along the first direction D1 may be understood as the signal line located in the line region S2, and the scan line GL extending along the second direction D2 may be understood as the signal line located in the circuit region S1.

Referring to FIG. 1, it is further to be noted that a pixel driving circuit may or may not be disposed in an intersection region between the circuit region S1 and the line region S2. It is to be understood that if a pixel driving circuit is disposed in the intersection region between the circuit region S1 and the line region S2, the pixel density can be increased and the display effect can be improved. However, compared with the case where the intersection region has only signal lines such as data lines and scan lines, the pixel driving circuit occupies the space for disposing the signal lines in the line region to a certain extent, thereby increasing the difficulty in disposing the signal lines. Therefore, those skilled in the art may determine whether to dispose a pixel driving circuit in the intersection region according to actual requirements, which is not limited in the embodiment of the present disclosure.

Further, optionally, the barrier structure is located between the circuit region S1 and the first opening 21, and/or the barrier structure is located between the line region S2 and the first opening 21. Specifically, the barrier structure may be disposed only between the circuit region S1 and the first opening 21, may be disposed only between the line region S2 and the first opening 21, or may be disposed both between the circuit region S1 and the first opening 21 and between the line region S2 and the first opening 21.

Figure 14:
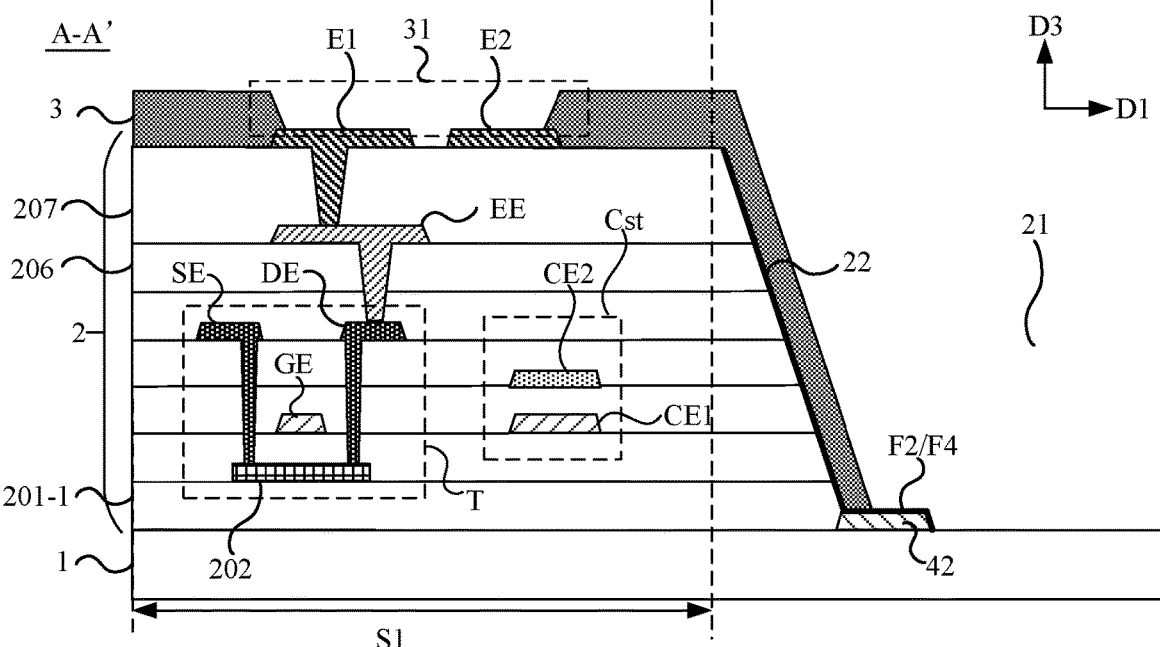
FIG. 14 is another sectional view of the array substrate taken along a section line A-A' in FIG. 1.

The barrier structure being located only between the circuit region S1 and the first opening 21 may be specifically understood as that the barrier structure is located between a pixel driving circuit of the circuit region S1 and the first opening 21. Exemplarily, FIG. 5 to FIG. 8 and FIG. 11 to FIG. 14 all show the example where the barrier structure 42 is located between the circuit region S1 and the first opening 21. Referring to FIG. 14, devices such as a thin-film transistor T and a capacitor Cst for forming a pixel driving circuit are disposed in the circuit region S1. The barrier structure 42 is disposed between the circuit region S1 and the first opening 21, so that a step (the upper surface F4 of the barrier structure 42 in FIG. 14 is the step surface F2 of the step) can be formed on the first side wall 22 of the drive layer 2 which is inclined towards the circuit region S1 at the first opening 21. Therefore, the first light-shielding layer 3 can extend to the step surface F2, the contact between the first light-shielding layer 3 and the base 1 can be avoided, and the peeling phenomenon of the first light-shielding layer 3 is further avoided.

Based on the preceding description, if the barrier structure 42 is disposed between the circuit region S1 and the first opening 21, the barrier structure 42 may be disposed in the same layer as the original structure made of metal, a semiconductor or other materials in the circuit region S1, or a film layer may be added for disposing the barrier structure 42. In addition, the closer the film layer where the barrier structure 42 is located is to the base 1, the more regions of the first side wall 22 are covered by the first light-shielding layer 3, and the better the light-shielding effect is, so that the light reflection problem can be improved; and the light (ambient light or light emitted by other light-emitting elements) radiated from the first side wall 22 side to the active layer 202 can be better shielded, and thus the threshold shift of the thin-film transistor can be improved. For optional arrangement manners of the barrier structure 42 between the circuit region S1 and the first opening 21, reference may be made to the preceding description and is not repeated here.

Figure 15:
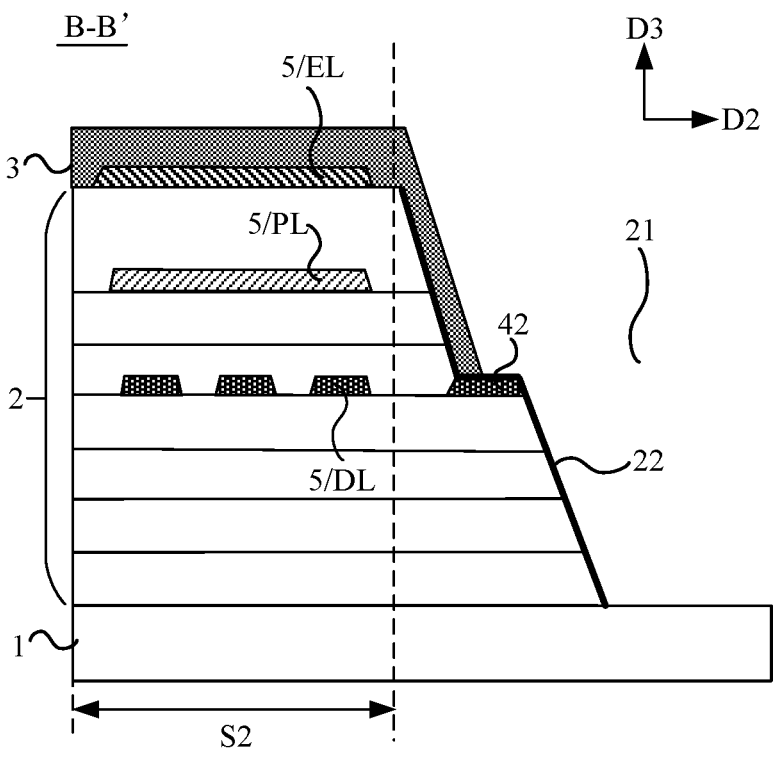
FIG. 15 is a sectional view of the array substrate taken along BB' in FIG. 1.
Figure 16:
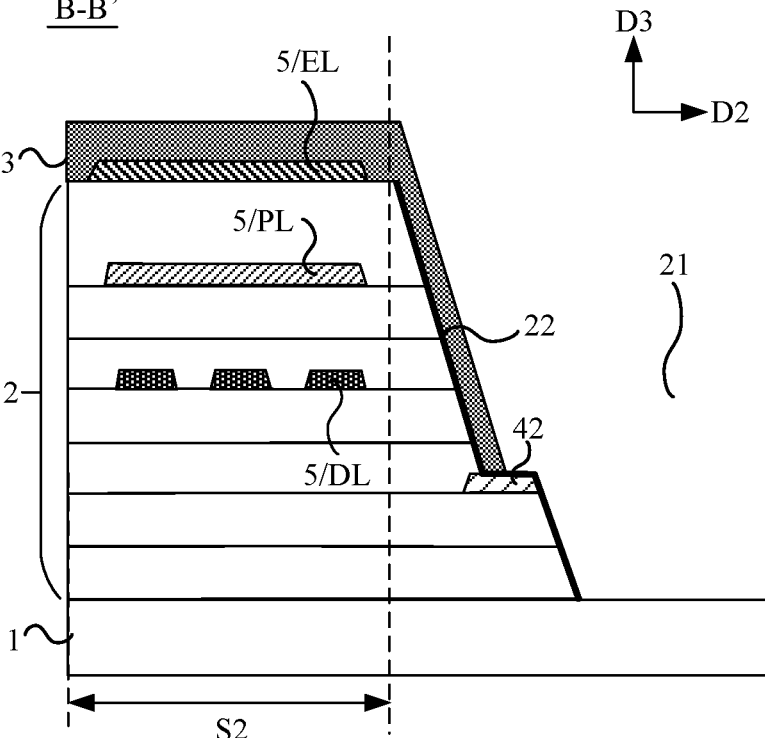
FIG. 16 is another sectional view of the array substrate taken along BB' in FIG. 1.

The barrier structure being located between the line region S2 and the first opening 21 may be specifically understood as that the barrier structure is located between a line signal of the line region S2 and the first opening 21. Exemplarily, the first direction D1 being parallel to the extension direction of the data line DL and the second direction D2 being parallel to the extension direction of the scan line GL is taken as an example. FIG. 15 is a sectional view of the array substrate taken along BB' in FIG. 1, and FIG. 16 is another sectional view of the array substrate taken along BB' in FIG. 1. As shown in FIG. 15 and FIG. 16, the barrier structure 42 is located between the line region S2 and the first opening 21; at this time, optionally, the barrier structure 42 is disposed in the same layer as a signal line 5 (shown in FIG. 15), or the film layer where the barrier structure 42 is located is disposed between the film layer where the signal line 5 is located and the base 1 (as shown in FIG. 16).

It is to be understood that in the drive layer 2, the insulating layer (including the inorganic insulating layer and the organic insulating layer) in the line region S2 is the same as the insulating layer in the circuit region S1, except that a part of the insulating layer around the first opening 21 is cut off by the first opening 21.

As described above, the signal lines located in the line region S2 specifically refer to signal lines extending along the first direction D1. It is to be noted that referring to FIG. 1 and FIG. 15, at least one layer of signal lines 5 extending along the first direction D1 may be disposed in the line region S2 according to requirements. One layer of signal lines may include one type of signal lines or may include multiple types of signal lines for transmitting different signals, which is not limited in the embodiment of the present disclosure. Exemplarily, FIG. 15 and FIG. 16 show the example where three layers of signal lines 5 are disposed in the line region S2. As shown in FIG. 15, if the line region S2 has multiple layers of signal lines, the barrier structure 42 being disposed in the same layer as the signal line 5 may be understood as that the barrier structure 42 is disposed in the same layer as a signal line (such as the data line DL) closest to the base 1 in the line region S2. As shown in FIG. 16, if the line region S2 has multiple layers of signal lines, the film layer where the barrier structure 42 is located being located between the film layer where the signal line 5 is located and the base 1 may be understood as that the film layer where the barrier structure 42 is located is disposed between the film layer where the signal line (such as the data line DL) closest to the base 1 is located in the line region S2 and the base 1. In this manner, the first light-shielding layer 3 can cover more regions of the first side wall 22 between the line region S2 and the first opening 21 and better shield the signal lines in the line region S2, so that the light reflection problem of the signal lines in the line region S2 can be improved.

If the first direction D1 is parallel to the extension direction of the data line DL and the second direction D2 is parallel to the extension direction of the scan line, the signal lines of the line region S2 may include at least one of the data line DL and a power supply line. The power supply line may include a power supply line may for transmitting a PVDD signal, and/or a power supply line for transmitting a PVEE signal (the PVDD signal and the PVEE signal are understood with reference to FIG. 9 and FIG. 10).

Exemplarily, FIG. 15 and FIG. 16 show the example where the signal line 5 of the line region S2 includes the data line DL, a first power supply line PL and a second power supply line EL. The first power supply line PL and the second power supply line EL may be configured to transmit the PVDD signal and the PVEE signal, respectively. For example, the first power supply line PL is configured to transmit the PVDD signal, and the second power supply line EL is configured to transmit the PVEE signal; or the first power supply line PL is configured to transmit the PVEE signal and the second power supply line EL is configured to transmit the PVDD signal.

As shown in FIG. 15, the width of the first power supply line PL and the width of the second power supply line EL along the second direction D2 may be greater than the width of the data line DL along the second direction D2. In this manner, the resistance of the first power supply line PL and the resistance of the second power supply line EL can be reduced, and thus the power consumption can be reduced. In addition, as shown in FIG. 15, the data line DL, the first power supply line PL and the second power supply line EL may be disposed in different film layers, respectively, so that the difficulty of wiring can be reduced and the risk of short circuits of different types of signal lines can be reduced. In addition, the width of the line region S2 along the second direction D2 can also be reduced, so that a space for providing the first opening 21 is ensured, and the transparent display effect is further ensured.

It is to be noted that the preceding arrangement manner of signal lines is merely illustrative. In other embodiments, the signal line in the line region S2 may include only the data line DL, and the first power supply line PL and the second power supply line EL may be disposed in the circuit region S1. In other embodiments, both the circuit region S1 and the line region S2 may include the first power supply line PL and the second power supply line EL, the first power supply line PL of the circuit region S1 and the first power supply line PL of the line region S2 are connected to each other, and the second power supply line EL of the circuit region S1 and the second power supply line EL of the line region S2 are connected to each other, so that the signal uniformity of the PVDD signal and the PVEE signal can be improved, and thus the display effect is further improved.

Figure 17:
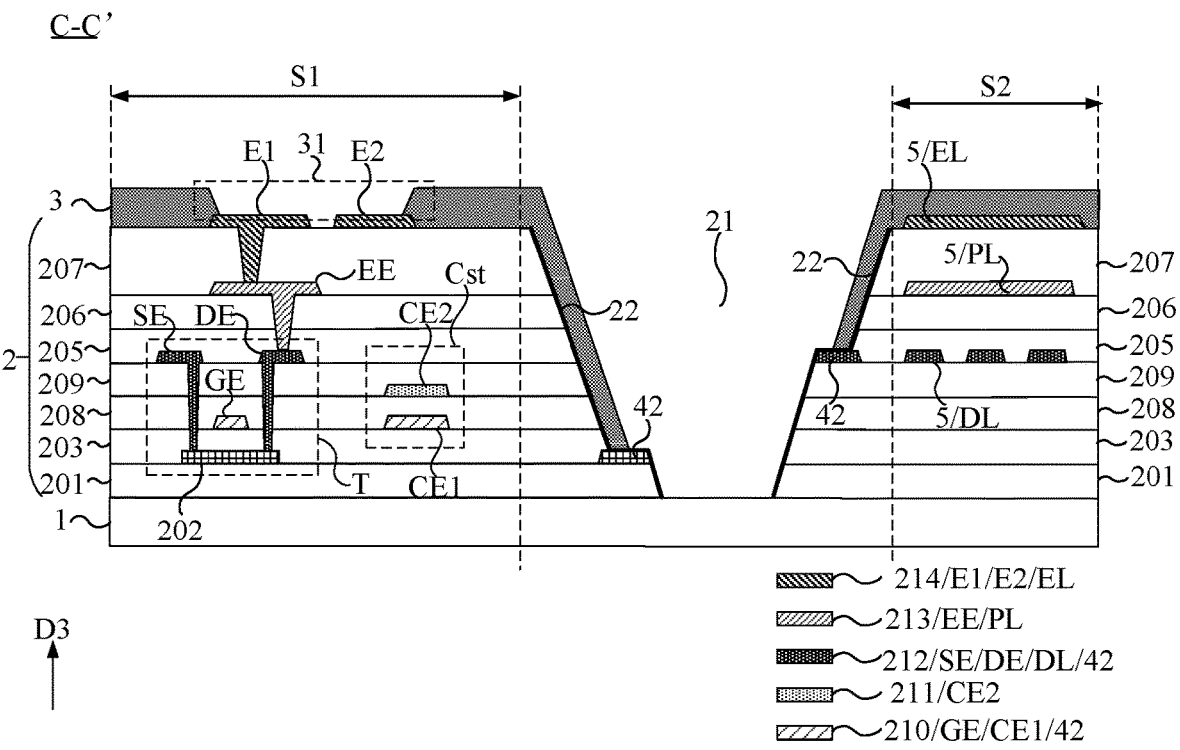
FIG. 17 is a sectional view of the array substrate taken along a section line C-C' in FIG. 1.

FIG. 17 is a sectional view of the array substrate taken along a section line C-C' in FIG. 1. As shown in FIG. 17, in an embodiment, the barrier structure 42 may be located between the circuit region S1 and the first opening 21 and also between the line region S2 and the first opening 21. In this manner, the first light-shielding layer 3 can completely shield the side wall of the drive layer 2 at the first opening 21 from light, and the first light-shielding layer 3 can be received by the step surface formed by the barrier structure 42, so that the contact between first light-shielding layer 3 and the base 1 is avoided, and the peeling phenomenon of the first light-shielding layer 3 can be avoided.

The film layer structure of the drive layer 2 is exemplarily described below with reference to FIG. 17. As shown in FIG. 17, in a specific embodiment, optionally, the film layer of the drive layer 2 includes an active layer 202, a gate insulating layer 203, a first metal layer 210, a first interlayer insulating layer 208, a capacitor metal layer 211, a second interlayer insulating layer 209, a second metal layer 212, a passivation layer 205, a first planarization layer 206, a third metal layer 213, a second planarization layer 207 and a fourth metal layer 214 which are laminated in sequence. A connection electrode E1 and a connection node E2 of the drive layer 2 are located in the fourth metal layer 214, and a second power supply line EL may also be located in the fourth metal layer. In addition, a buffer layer 201 may be disposed between the active layer 202 and the base 1. The first metal layer 210 may be configured to form a gate GE of a thin-film transistor T and a first capacitor plate CE1 of a capacitor Cst. Moreover, the first metal layer 210 may be configured to form a scan line for electrical connection with and the gate GE. The capacitor metal layer 211 may be configured to form a second capacitor plate CE2 of the capacitor Cst. The second metal layer 212 may be configured to form a source SE and a drain GE of the thin-film transistor T and a data line DL for electrical connection with the source SE. The third metal layer 213 may be configured to form a transition electrode EE and a first power supply line PL, where the connection electrode E1 is electrically connected to the thin-film transistor T through the transition electrode EE. Openings for the preceding insulating layers such as the buffer layer 201, the gate insulating layer 203, the first interlayer insulating layer 208, the second interlayer insulating layer 209, the passivation layer 205, the first planarization layer 206 and the second planarization layer 207 are correspondingly configured in the region where the first opening 21 is provided, and the openings of the various insulating layers communicate with each other to form the first opening 21.

It is to be noted that the preceding film layer structure of the drive layer is merely illustrative and not limiting, and the film layer structure of the entire drive layer may be specifically adjusted according to the arrangement manner of circuit elements in the circuit region, which is not limited in the embodiment of the present disclosure.

Referring to FIG. 17, since circuit elements such as the thin-film transistor Tin the circuit region S1 and the signal line 5 in the line region S2 may be located in different film layers, the light shielding requirements of the circuit region S1 and the light shielding requirements of the line region S2 may be different. Therefore, the barrier structure 42 between the circuit region S1 and the first opening 21 and the barrier structure 42 between the line region S2 and the first opening 21 may be located in different film layers so that the light shielding requirements of different regions can be satisfied. Exemplarily, FIG. 17 shows the example where the barrier structure 42 between the circuit region S1 and the first opening 21 is disposed in the same layer as the active layer 202 of the thin-film transistor T, and the barrier structure 42 between the line region S2 and the first opening 21 is disposed in the same layer as the data line DL. In this manner, the light shielding requirements of the thin-film transistor T in the circuit region S1 can be satisfied, the threshold shift of the thin-film transistor can be improved, and the problem of light reflection of the circuit region S1 can be solved; and the light shielding requirements of the signal line 5 in the line region SS can be satisfied, and the problem of light reflection of the line region S2 can be solved.

Figure 18:
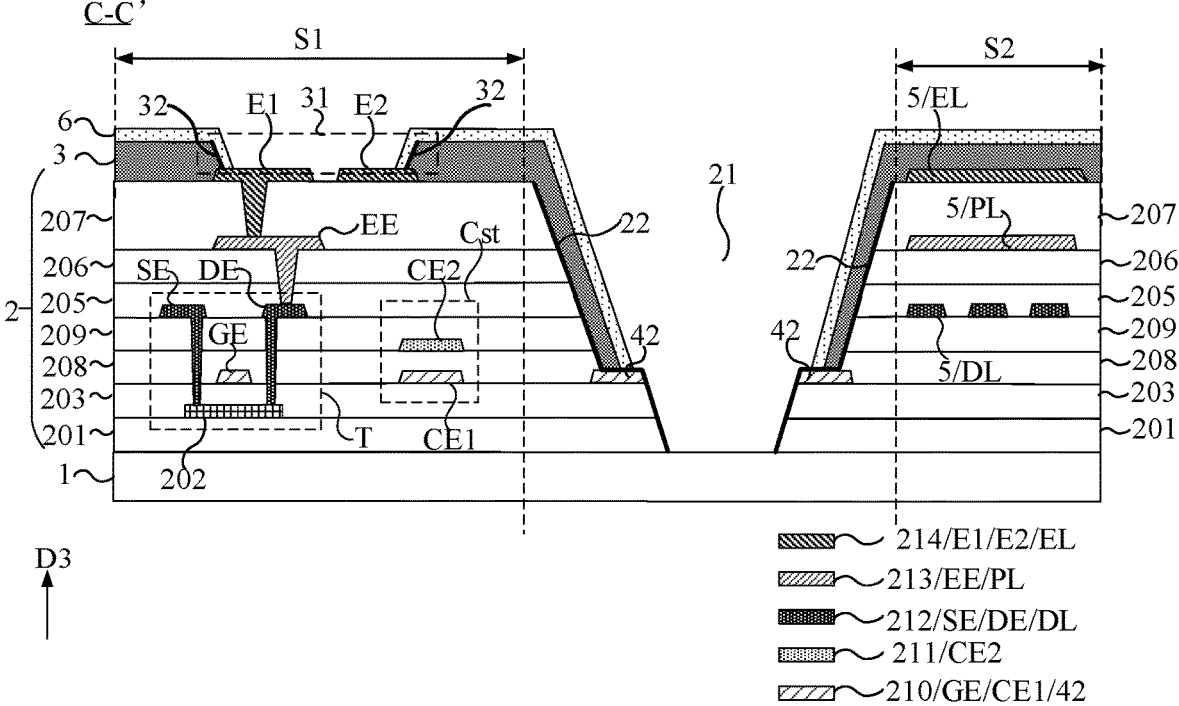
FIG. 18 is another sectional view of the array substrate taken along a section line C-C' in FIG. 1.

Of course, this arrangement manner is merely illustrative. FIG. 18 is another sectional view of the array substrate taken along a section line C-C' in FIG. 1. As shown in FIG. 18, in other embodiments, optionally, the barrier structure 42 located between the circuit region S1 and the first opening 21 is disposed in the same layer as the barrier structure 42 located between the line region S2 and the first opening 21. Exemplarily, FIG. 18 shows the example where the barrier structure 42 between the circuit region S1 and the first opening 21 and the barrier structure 42 between the line region S2 and the first opening 21 are both disposed in the same layer as the gate GE of the thin-film transistor T. In this manner, the light shielding requirements of the circuit region S1 and the light shielding requirements of the line region S2 can be simultaneously satisfied, and the first light-shielding layer 3 is received by the step surface formed by the barrier structure 42, so that the contact between the first light-shielding layer 3 and the base 1 is avoided, and thus the peeling phenomenon of the first light-shielding layer 3 is avoided.

When a conductive film layer having a certain pattern in the drive layer (for example, film layers where structures such as the active layer, the gate, the source, the drain and the signal line are located) is prepared, a mask needs to be used. Specifically, the flow of preparing the conductive film mainly includes steps described below. An integral conductive film layer is formed and covered with a photoresist, the photoresist is covered with a mask having a certain opening pattern, the photoresist is patterned by processes such as exposure and development, then the integral conductive film layer is etched under the protection of the patterned photoresist so that a conductive film layer having a certain pattern is formed, and finally the photoresist is removed. When the barrier structure is disposed in the same layer as the original structure in the drive layer, the mask corresponding to the film layer where the structure is located needs to be adjusted; when an additional film layer is used for forming the barrier structure, a mask of the film layer where the barrier structure is located needs to be correspondingly added. However, the costs of the mask is relatively high. In the embodiment, the barrier structure 42 between the circuit region S1 and the first opening 21 is disposed in the same layer as the barrier structure 42 between the line region S2 and the first opening 21, so that the number of masks needing redesign of the opening pattern is reduced, thus the costs are reduced, and moreover, the complexity of the film layer structure and the preparation difficulty are reduced.

In summary, the preceding embodiments illustrate, based on the structure of the drive layer, in detail the region where the barrier structures is disposed and the feasible implementation for disposing the film layer. The shape of the barrier structure is described further below.

Figure 19:
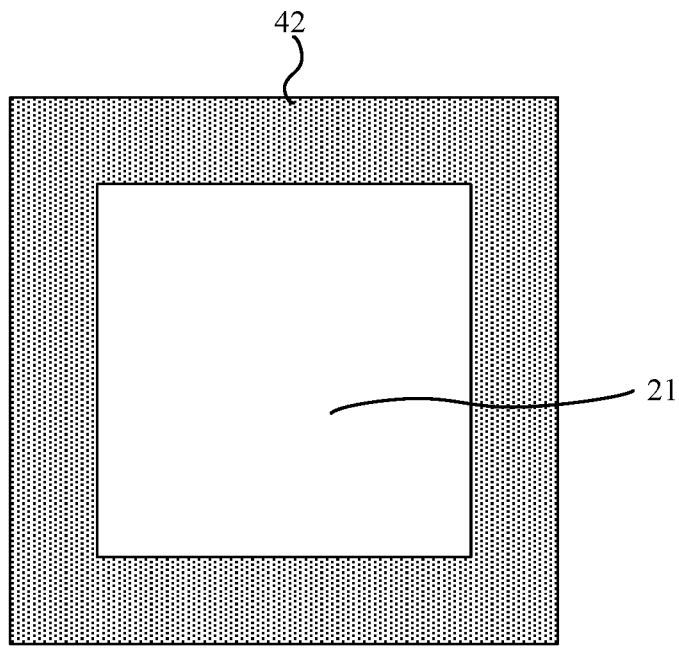
FIG. 19 is a top view of a barrier structure in an array substrate according to an embodiment of the present disclosure.

FIG. 19 is a top view of a barrier structure in an array substrate according to an embodiment of the present disclosure. As shown in FIG. 19, optionally, the barrier structure 42 surrounds the first opening 21. In this manner, the first light-shielding layer 3 can be received by the step surface formed by the barrier structure 42 so that the contact between the first light-shielding layer 3 and the base 1 is avoided, and thus the peeling phenomenon of the first light-shielding layer 3 is avoided; moreover, the first light-shielding layer 3 can completely shield the side wall of the drive layer 2 at the first opening 21 from light, so that problems such as light reflection and the threshold shift of the thin-film transistor can be improved.

Figure 20:
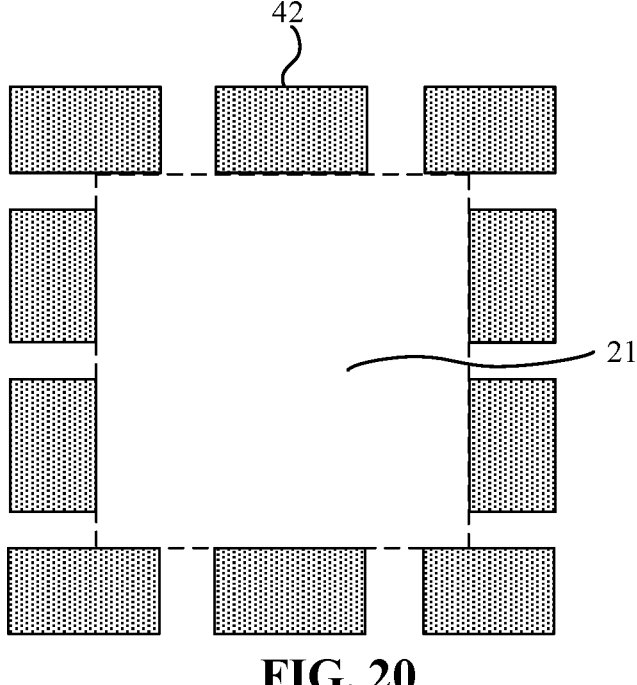
FIG. 20 is another top view of a barrier structure in an array substrate according to an embodiment of the present disclosure.

It is to be noted that FIG. 19 only shows the example where the barrier structure is in an annular shape. FIG. 20 is another top view of a barrier structure in an array substrate according to an embodiment of the present disclosure. As shown in FIG. 20, in other embodiments, multiple discrete barrier structures 42 may be included around the first opening 21, and the multiple discrete barrier structures 42 surround the first opening 21. In this manner, the first light-shielding layer 3 can also be received by the step surface formed by the barrier structure 42, so that the contact between the first light-shielding layer 3 and the base 1 is avoided, and thus the peeling phenomenon of the first light-shielding layer 3 is avoided.

Figure 21:
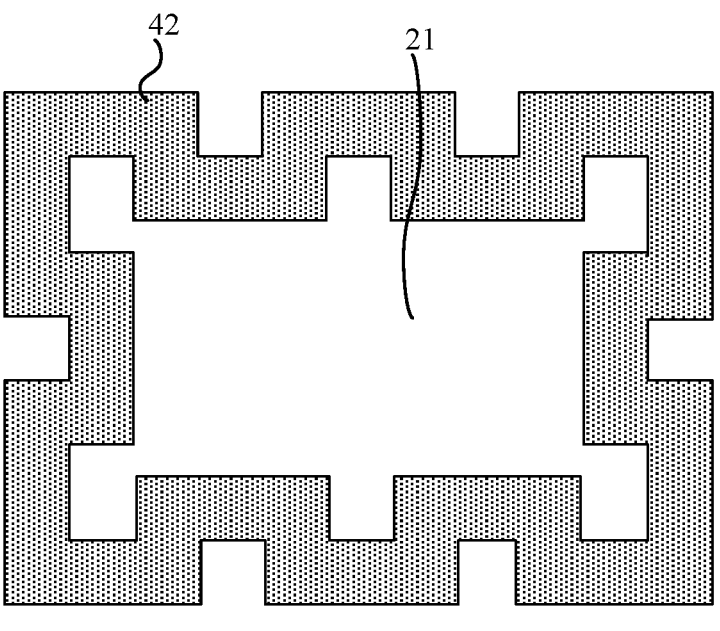
FIG. 21 is another top view of a barrier structure in an array substrate according to an embodiment of the present disclosure.
Figure 22:
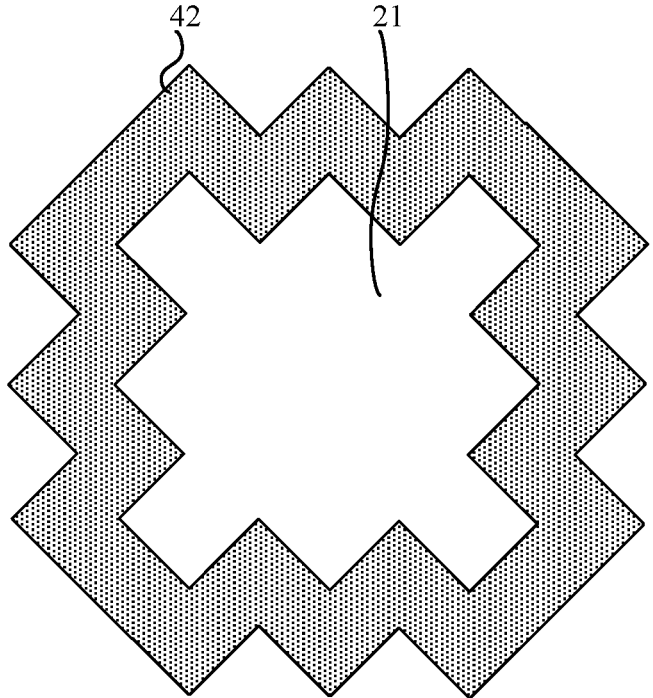
FIG. 22 is another top view of a barrier structure in an array substrate according to an embodiment of the present disclosure.
Figure 23:
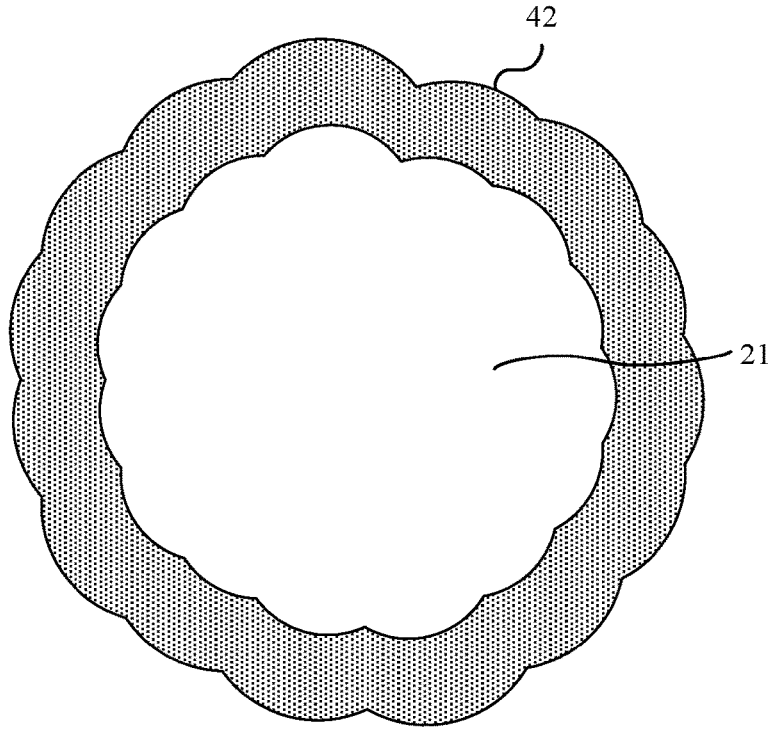
FIG. 23 is another top view of a barrier structure in an array substrate according to an embodiment of the present disclosure.

Optionally, an edge of the barrier structure includes at least one of a straight line, a broken line or a wavy line. Exemplarily, FIG. 19 and FIG. 20 show the example where the edge of the barrier structure 42 is a straight line. In other embodiments, FIG. 21 is another top view of a barrier structure in an array substrate according to an embodiment of the present disclosure, FIG. 22 is another top view of a barrier structure in an array substrate according to an embodiment of the present disclosure, and FIG. 23 is another top view of a barrier structure in an array substrate according to an embodiment of the present disclosure. As shown in FIG. 21 and FIG. 22, the edge of the barrier structure 42 may include a broken line; as shown in FIG. 23, the edge of the barrier structure 42 may also include a wavy line. In this manner, the contact area between the barrier structure 42 and the first light-shielding layer 3 can be increased so that the film adhesion between the barrier structure 42 and the first light-shielding layer 3 can be increased, the contact between the first light-shielding layer 3 and the base 1 is avoided, and the peeling phenomenon of the first light-shielding layer 3 is avoided.

In summary, the preceding embodiments describe the arrangement manner of the barrier structure in detail. The barrier structure is disposed in the drive layer, so that the step surface can be formed by at least part of the upper surface of the barrier structure to receive the first light-shielding layer, the contact between the first light-shielding layer and the base is avoided, and the peeling phenomenon of the first light-shielding layer is avoided; moreover, at least part of the side wall of the drive layer at the first opening can be covered by the first light-shielding layer, so that a good light shielding effect can be achieved, and problems such as light reflection and the threshold shift of the thin-film transistor can be improved.

Based on any one of the preceding embodiments, referring to FIG. 18, optionally, the array substrate further includes a protective layer 6, where the protective layer 6 is formed on the first light-shielding layer 3; and the protective layer 6 extends from the second opening 31 to the first opening 21, and the protective layer 6 covers a second side wall 32 of the first light-shielding layer 3 at the second opening 31 and covers part of the first light-shielding layer 3 extending to the first side wall 22. The protective layer 6 is formed on the first light-shielding layer 3, so that the protective layer 6 covers a side of the first light-shielding layer 3 away from the base 1 and covers the second side wall 32 of the first light-shielding layer 3 at the second opening 21 and the part of the first light-shielding layer 3 extending to the first side wall 22; therefore, the first light-shielding layer 3 can be protected by the protective layer 6 so that the damage to the first light-shielding layer 3 in a subsequent process and the resulting impact on the light-shielding effect can be avoided. Exemplarily, the protective layer 6 may be made of an inorganic material or an organic material, which is not limited in the embodiment of the present disclosure.

Figure 24:
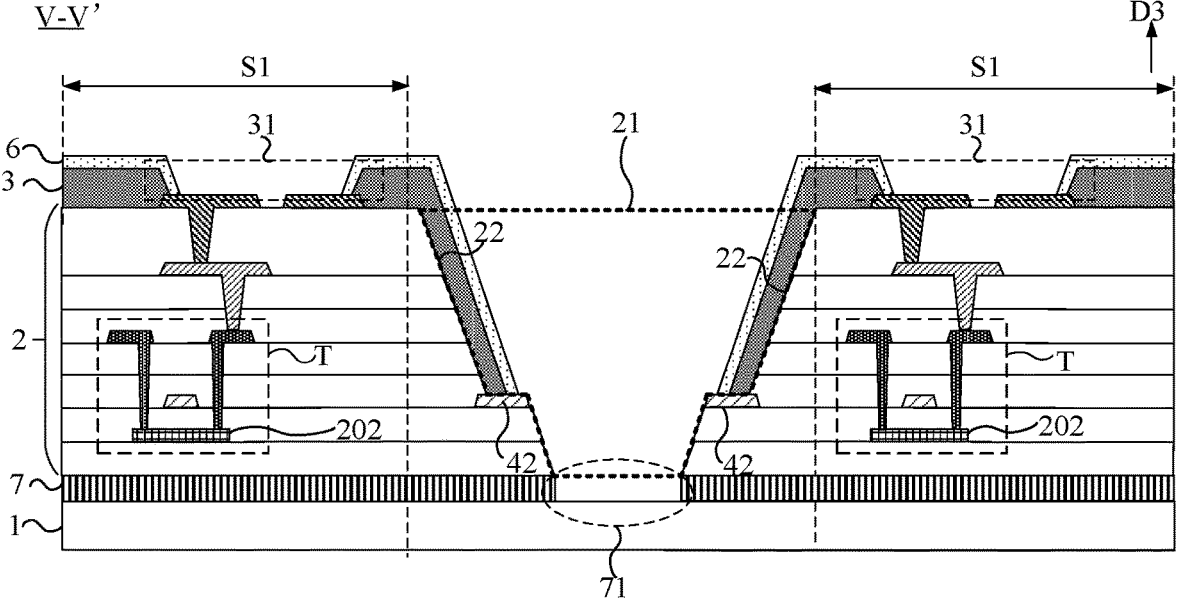
FIG. 24 is a sectional view of the array substrate taken along a section line V-V' in FIG. 1.

Based on any one of the preceding embodiments, FIG. 24 is a sectional view of the array substrate taken along a section line V-V' in FIG. 1. As shown in FIG. 24, optionally, the array substrate further includes a second light-shielding layer 7, where the second light-shielding layer 7 is located between the drive layer 2 and the base 1. The second light-shielding layer 7 includes a third opening 71, and the third opening 71 overlaps the first opening 21.

Specifically, the third opening 71 overlapping the first opening 21 specifically refers to that the third opening 71 overlaps the first opening 21 along the thickness direction D3 of the array substrate. As shown in FIG. 24, optionally, the opening area of a side of the third opening 71 farthest from the base 1 is equal to the opening area of a side of the first opening 21 closest to the base 1. In this manner, the second light-shielding layer 7 can well support the above film layer structures such as the drive layer 2 and the first light-shielding layer 3, and can completely shield against the light radiated from the base 1 to the active layer 202 in the circuit region S1 to prevent this part of light from leaking into the active layer 202, so that the threshold shift of the thin-film transistor caused by light is further improved; moreover, the impact on the area of the light-transmitting region can be avoided, and thus the transparent display effect is ensured. Of course, due to limitations of the process precision, the opening area of the side of the third opening 71 farthest from the base 1 and the opening area of the side of the first opening 21 closest to the base 1 may not be exactly equal, and certain tolerances are allowed for.

Optionally, the second light-shielding layer 7 is an organic light-shielding adhesive, for example, a black optical adhesive. The black optical adhesive has a good light-shielding effect, and is easier to pattern (only needing processes such as exposure and development) than a material having a light-shielding effect such as metal, so that process steps can be simplified and the costs can be saved.

Figure 25:
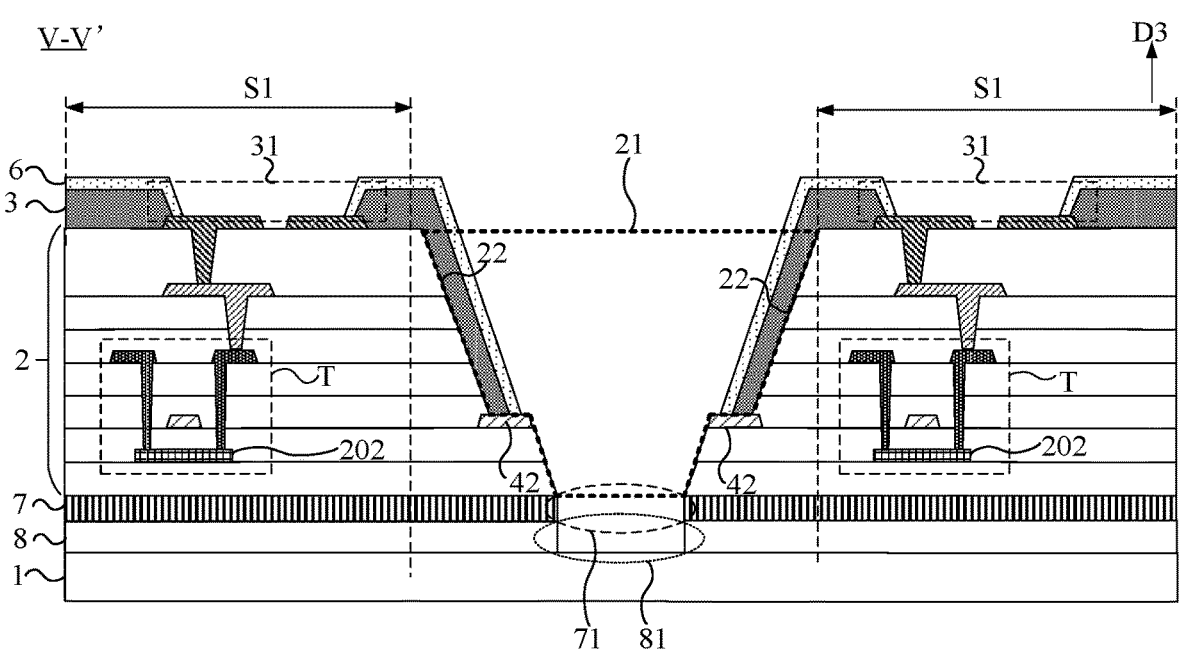
FIG. 25 is another sectional view of the array substrate taken along a section line V-V' in FIG. 1.

FIG. 25 is another sectional view of the array substrate taken along a section line V-V' in FIG. 1. As shown in FIG. 25, optionally, the array substrate further includes a third buffer layer 8, where the third buffer layer 8 is located between the second light-shielding layer 7 and the base 1. The third buffer layer 8 is disposed between the second light-shielding layer 7 and the base 1, so that the risk of peeling of the second light-shielding layer 7 can be reduced. Exemplarily, the third buffer layer 8 may be made of an inorganic material.

As shown in FIG. 25, optionally, a fourth opening 81 is configured in the third buffer layer 8 corresponding to the third opening 71, which is conducive to reducing the impact on light transmittance. Of course, this arrangement manner is not limiting. In other embodiments, no opening may be configured in the third buffer layer 8, which is not limited in the embodiment of the present disclosure.

Figure 26:
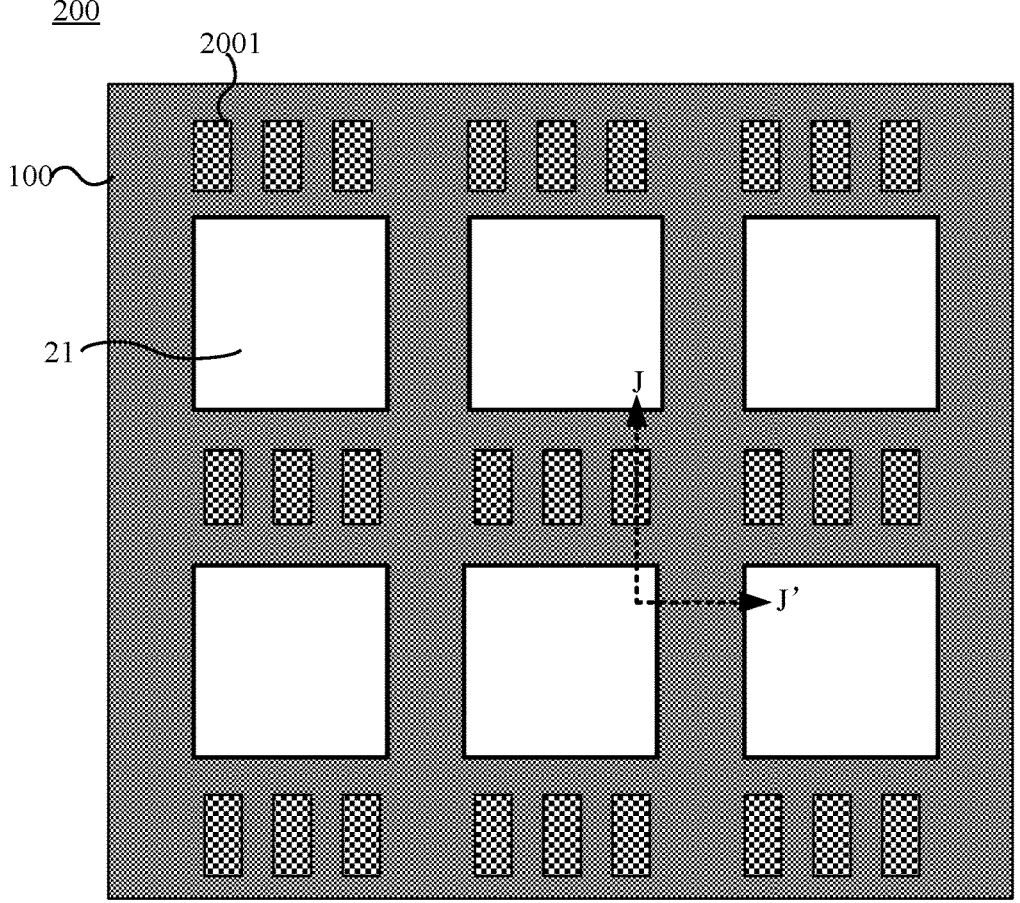
FIG. 26 is a top view of a display panel according to an embodiment of the present disclosure.
Figure 27:
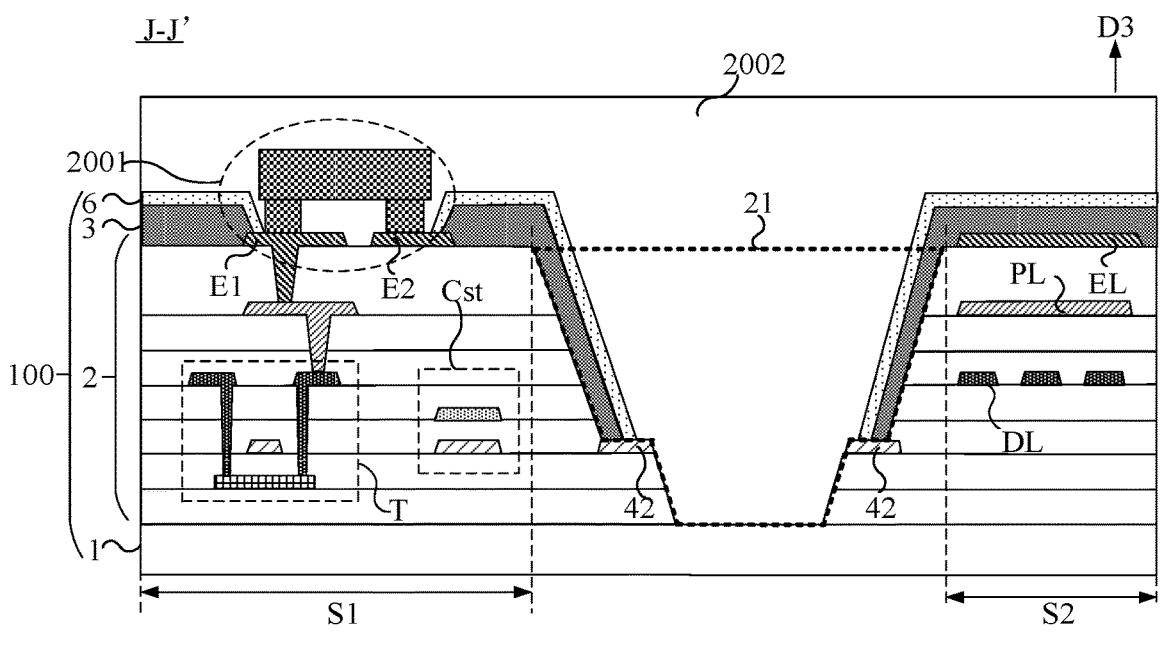
FIG. 27 is a sectional view of the display panel taken along JJ' in FIG. 26.

Based on the same inventive concept, an embodiment of the present disclosure further provides a display panel. The display panel is a transparent display panel. FIG. 26 is a top view of a display panel according to an embodiment of the present disclosure, and FIG. 27 is a sectional view of the display panel taken along JJ' in FIG. 26. As shown in FIG. 26 and FIG. 27, the display panel 200 configured in the embodiment of the present disclosure includes light-emitting elements 2001 and the array substrate 100 (the array substrate 100 in FIG. 27 is merely illustrative of the array substrate shown in FIG. 18.) according to any one of the preceding embodiments. The light-emitting elements 2001 are located on one side of the drive layer 2 away from the base 1, and the light-emitting elements 2001 are electrically connected to the drive layer 2. Exemplarily, a light-emitting element 2001 may be a micro light-emitting diode. As shown in FIG. 27, the light-emitting elements 2001 overlap the circuit region S1, and the light-emitting elements 2001 are electrically connected to a connection electrode E1 and a connection electrode E2 in the drive layer 2 so that electrical connection with pixel driving circuits is achieved. Since the display panel configured in the embodiment of the present disclosure includes the array substrate configured in any one of the preceding embodiments, the display panel has the same beneficial effects as the preceding array substrate. For the same part, reference may be made to the description of the preceding embodiments of the array substrate and is not repeated here.

Further, Still referring to FIG. 27, optionally, the display panel 200 further includes an encapsulation layer 2002, where the encapsulation layer 2002 covers the light-emitting elements 2001 and the first light-shielding layer 3, and the encapsulation layer 2002 fills the first opening 21. Specifically, the encapsulation layer 2002 filling the first opening 21 specifically refers to that the encapsulation layer 2002 fills a region within the first opening 21 which is not covered by a film layer such as the first light-shielding layer 3. The encapsulation layer 2002 encapsulates the array substrate 100 and the light-emitting elements 2001 to protect the light-emitting elements 2001 and the circuit elements and line structures in the array substrate 100 from water vapor erosion, so that the service life of the display panel is prolonged, and the transportation of the display panel is facilitated. Exemplarily, the encapsulation layer 2002 may be made of a transparent resin material to satisfy the requirements for high light transmittance of the transparent display panel.

Figure 28:
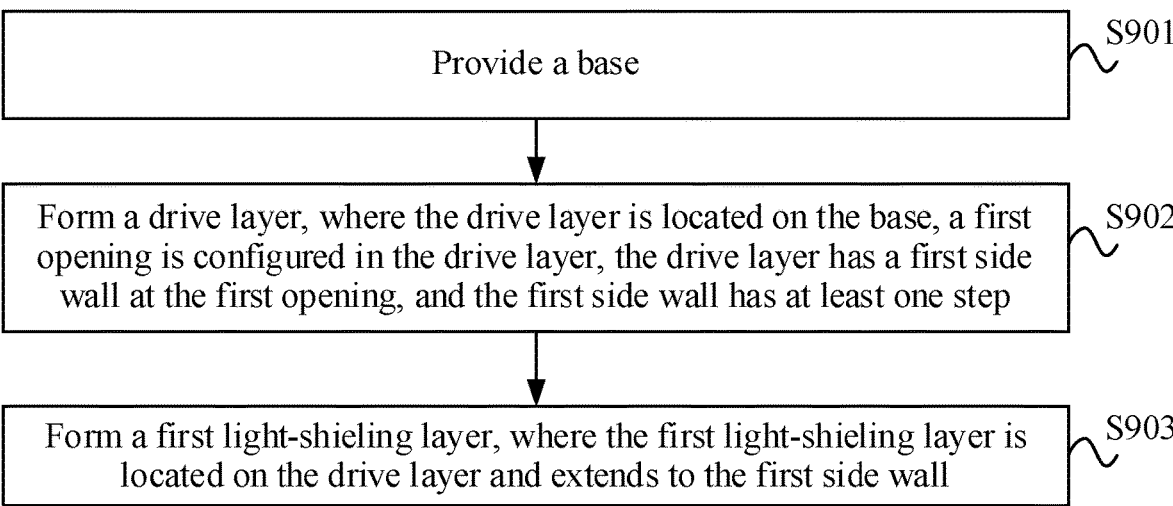
FIG. 28 is a flowchart of an array substrate preparation method according to an embodiment of the present disclosure.

Based on the same inventive concept, an embodiment of the present disclosure further provides an array substrate preparation method. FIG. 28 is a flowchart of an array substrate preparation method according to an embodiment of the present disclosure. As shown in FIG. 28, the preparation method includes steps described below.

In S901, a base is provided.

Exemplarily, the material of the base may be glass.

In S902, a drive layer is formed, where the drive layer is located on the base, a first opening is configured in the drive layer, the drive layer has a first side wall at the first opening, and the first side wall has at least one step.

The drive layer mainly includes structures such as pixel driving circuits for driving light-emitting elements to emit light and signal lines for transmitting signals to the pixel driving circuits.

The preparation method of the drive layer will be specifically described subsequently in conjunction with the specific structure of the drive layer, which is not repeated here.

In S903, a first light-shieling layer is formed, where the first light-shieling layer is located on the drive layer and extends to the first side wall.

Exemplarily, the material of the first light-shielding layer may be a black optical adhesive for absorbing light emitted towards the drive layer and absorbing light reflected outwards by the internal structure of the drive layer, so that the problem of light reflection is improved.

According to the array substrate preparation method configured in the embodiment of the present disclosure, the drive layer includes the first side wall having at least one step at the first opening, so that the first light-shielding layer can extend to the first side wall, the first light-shielding layer can end on a step surface of the first side wall, and the contact between the first light-shielding layer and the base is avoided. Therefore, the peeling phenomenon of the first light-shielding layer can be avoided while the light-shielding effect is improved, and thus the quality of the array substrate is ensured.

As described above, a barrier structure may be added to the driver layer so that the first side wall has the step. Accordingly, optionally, the preceding step (that is, S902) of forming the drive layer may include steps described below.

(a) A first film is formed.

(b) A barrier structure is formed, where the barrier structure is located on the first film and is in contact with the first film.

(c) A second film is formed, where the second film covers the barrier structure and the first film and is in contact with both the barrier structure and the first film.

(d) The first film and the second film are patterned so that the first opening of the drive layer is formed, where the first film is patterned so that a first film layer is formed, and the second film is patterned so that a second film layer is formed.

Based on the preceding explanation, the material of the first film layer and the material of the second film layer may both be inorganic materials. The first film may be understood as an inorganic insulating layer between the film layer where the barrier structure is located and the base, and the first film is patterned so that the preceding first film layer is formed. The second film may be understood as an inorganic insulating layer on one side of the barrier structure away from the base, and the second film is patterned so that the preceding second film layer is formed. The material of the barrier structure may be metal or a semiconductor. The etching gas used for etching the inorganic material etches the metal or the semiconductor at a relatively low rate, so that after the second film is etched, then the second film layer is formed, and the barrier structure is exposed, the barrier structure can block etching by the etching gas for part of the first film which is covered by the barrier structure; the etching gas etches part of the first film which is not covered by the barrier structure in the region where in the first opening is provided, and thus the first film layer is formed. Therefore, end positions of the first film layer and the second film layer can be adjusted by the barrier structure in one time of etching process, and the step surface of the step is formed by at least part of the upper surface of the barrier structure. In this manner, the process is simple and the processing precision of the first opening can be controlled relatively accurately.

It is to be noted that drawings of implementations in which the barrier structure is disposed show that the light-shielding layer is in contact with part of the upper surface of the barrier structure. The covering relationship between the light-shielding layer and the barrier structure may also include the manner in which the light-shielding layer completely covers the step surface formed by the barrier structure.

Exemplarily, FIGS. 29 to 37 are flowcharts for preparation of the array substrate shown in FIG. 18. The preparation flow of the array substrate shown in FIG. 18 is taken as an example for exemplary illustration of the array substrate preparation method.

Figure 29:
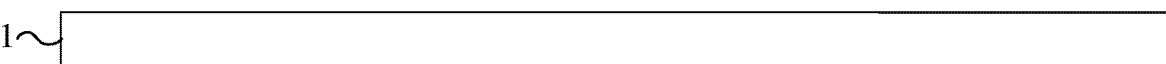
FIGS. 29 to 37 are flowcharts for preparation of the array substrate shown in FIG. 18.

In the first step, as shown in FIG. 29, a base 1 is provided.

Figure 30:
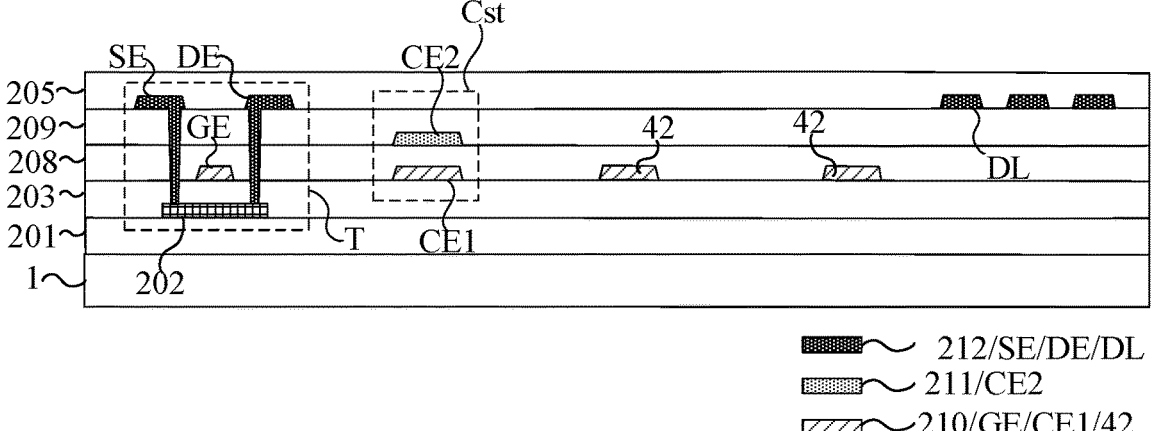

In the second step, as shown in FIG. 30, a buffer layer 201, an active layer 202 of a thin-film transistor T, a gate insulating layer 203, a first metal layer 210, a first interlayer insulating layer 208, a capacitor metal layer 211, a second interlayer insulating layer 209, a second metal layer 212 and a passivation layer 205 are sequentially formed on the base 1. A gate of the thin-film transistor T and a first capacitor plate CE1 of the capacitor Cst are formed in the first metal layer 210. In addition, in the embodiment, the barrier structure 42 is also located in the first metal layer 210. A second capacitor plate CE2 of the capacitor Cst is formed in the capacitor metal layer 211. A source SE and a drain DE of the thin-film transistor and a data line DL is formed in the second metal layer 212. The buffer layer 201, the gate insulating layer 203, the first interlayer insulating layer 208, the second interlayer insulating layer 209 and the passivation layer 205 are all inorganic insulating layers. The buffer layer 201 and the gate insulating layer 203 located between the barrier structure 42 and the base 1 may be understood as the preceding "first film"; and the first interlayer insulating layer 208, the second interlayer insulating layer 209 and the passivation layer 205 which are located on one side of the barrier structure 42 away from the base 1 may be understood as the preceding "second film".

Figure 31:
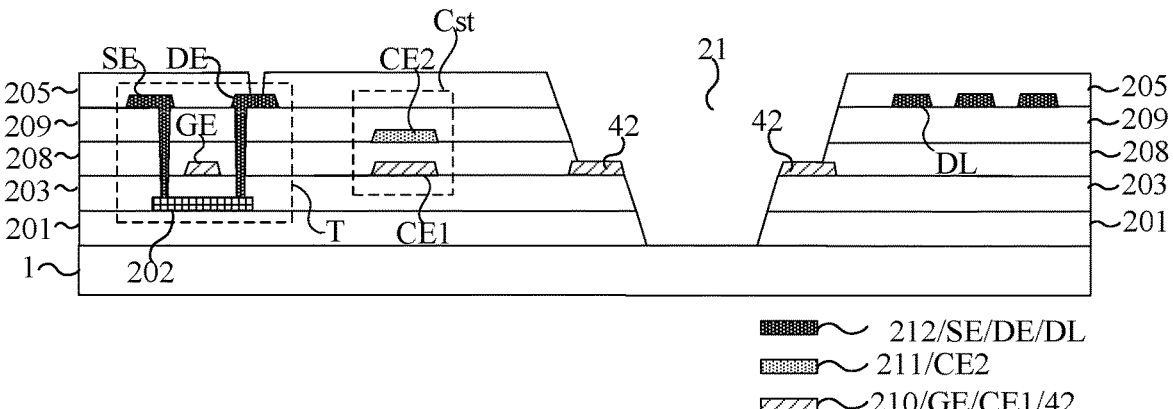

In the third step, as shown in FIG. 31, the passivation layer 205, the second interlayer insulating layer 209, the first interlayer insulating layer 208, the gate insulating layer 203 and the buffer layer 201 are patterned so that part of the first opening 21 is formed. Specifically, these inorganic insulating layers may be patterned by using the dry etching process. The passivation layer 205, the second interlayer insulating layer 209 and the first interlayer insulating layer 208 can expose the barrier structure 42 after being etched. Since the etch rate by the etching gas for the metal material is less than the etch rate by the etching gas for the inorganic insulating layer, part of the gate insulating layer 203 and part of the buffer layer 201 which are covered by the barrier structure 42 are not etched, and part of the gate insulating layer 203 and part of the buffer layer 201 which are not covered by the barrier structure 42 in the region where the first opening 21 is provided are etched, so that end positions of the first film layer (for example, the remaining gate insulating layer 203 and buffer layer 201) and the second film layer (for example, the remaining passivation layer 205, second interlayer insulating layer 209 and first interlayer insulating layer 208) are adjusted by the barrier structure 42 in one time of etching process, and the step surface of the step is formed by at least part of the upper surface of the barrier structure 42.

Figure 32:
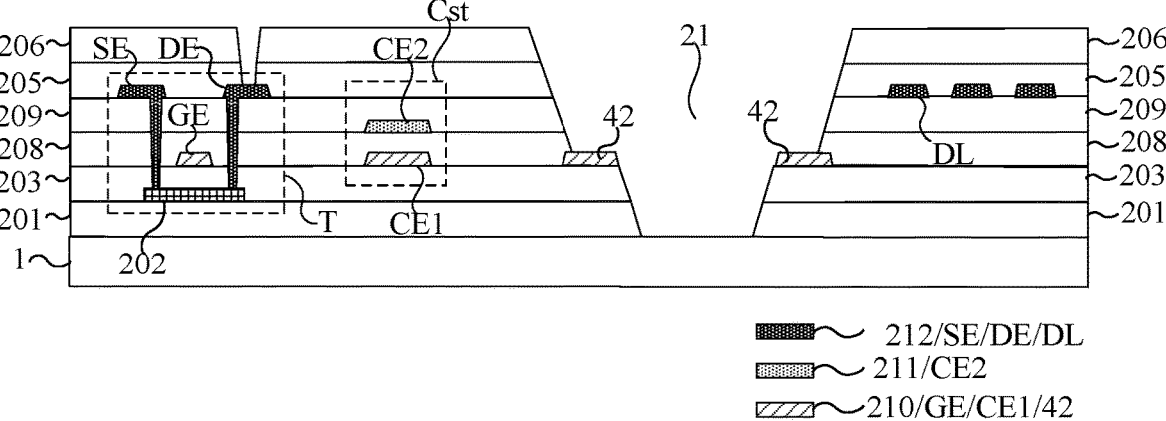

In the fourth step, as shown in FIG. 32, a patterned first planarization layer 206 is formed on one side of the passivation layer 205 away from the base 1. Specifically, the material of the first planarization layer 206 may be a photosensitive organic material, such as a transparent optical adhesive. After the entire layer of the first planarization layer is formed on the passivation layer 205, the first planarization layer may be patterned by processes such as exposure and development, so that the first planarization layer 206 shown in FIG. 32 is obtained, and the first planarization layer 32 has an opening corresponding to the region where the first opening 21 is provided.

Figure 33:
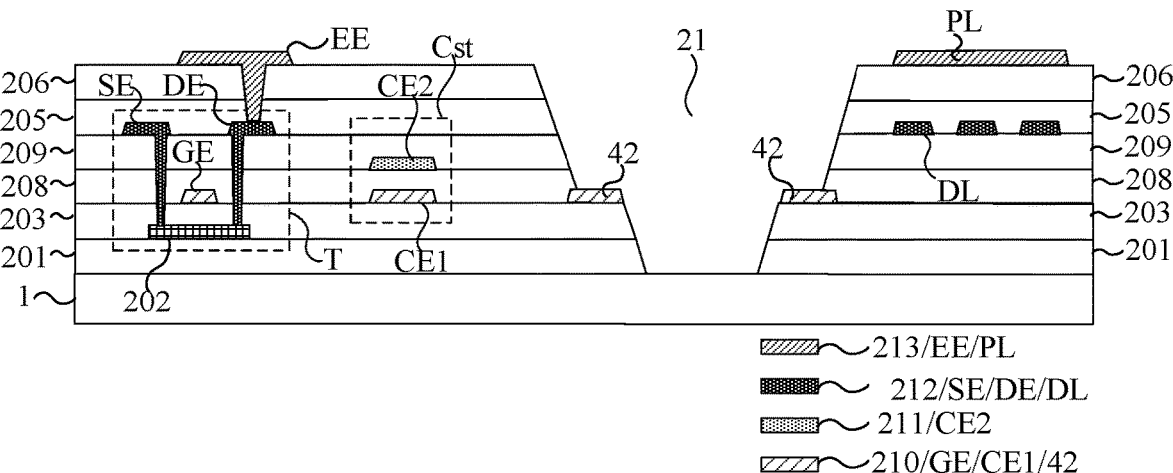

In the fifth step, as shown in FIG. 33, a third metal layer 213 is formed on the first planarization layer 206, and a transition electrode EE and a first power supply line PL are formed in the third metal layer 213. Referring to FIG. 31 to FIG. 33, the transition electrode EE is electrically connected to the drain DE of the thin film transistor T through via holes, corresponding to the drain DE, pre-configured in the first planarization layer 206 and the passivation layer 205.

Figure 34:
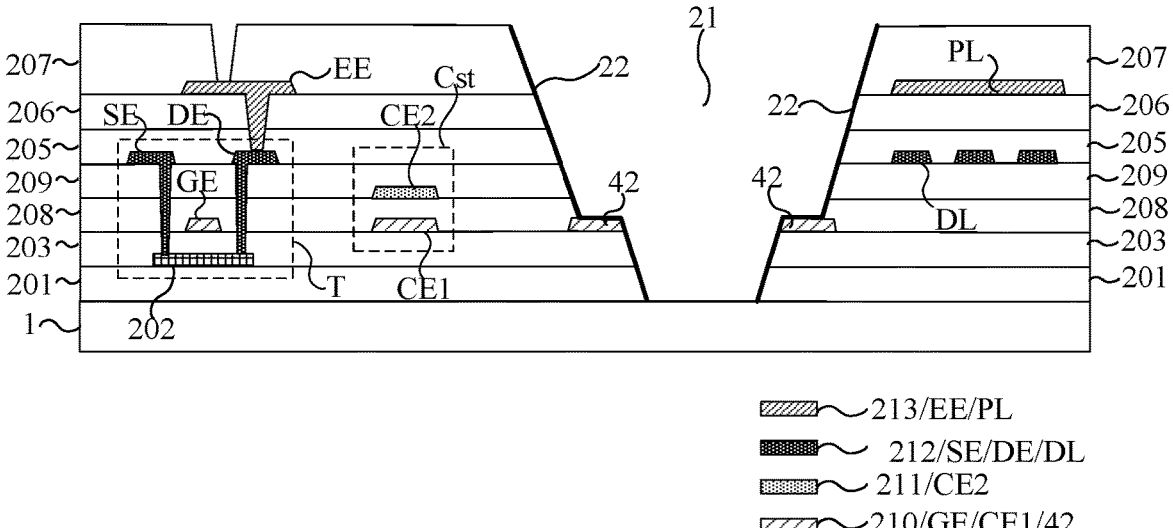

In the sixth step, as shown in FIG. 34, a patterned second planarization layer 207 is formed on one side of the third metal layer 213 away from the base 1. The preparation process of the second planarization layer 207 is the same as the reparation process of the first planarization layer 206 and is not repeated here.

Figure 35:
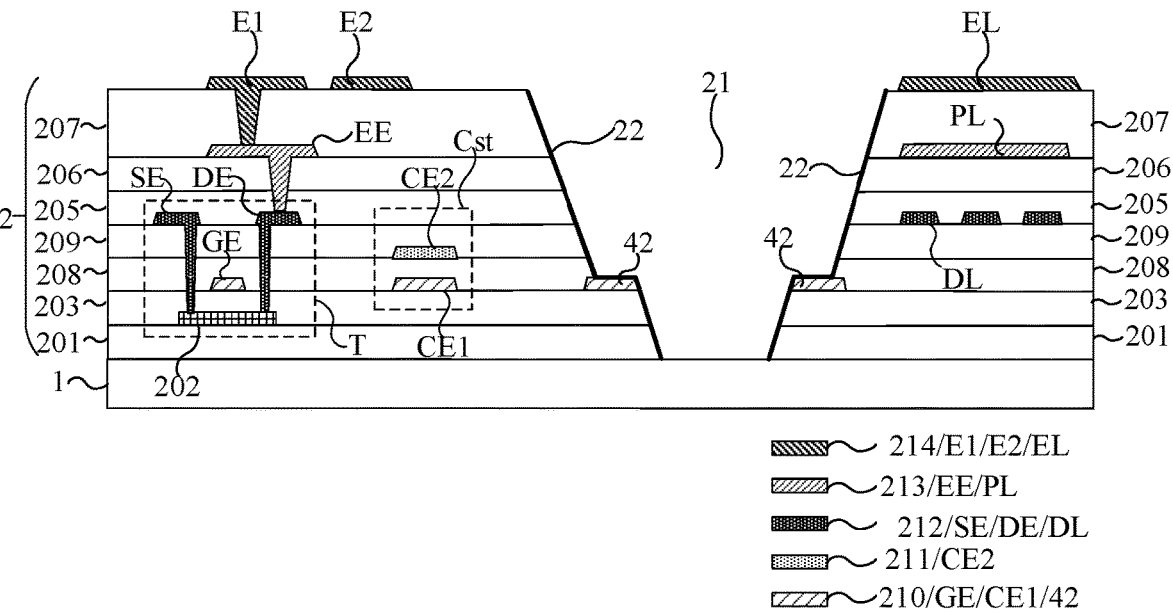

In the seventh step, as shown in FIG. 35, a fourth metal layer 214 is formed on one side of the second planarization layer 207 away from the base 1, and a connection electrode E1 and a connection electrode E2 for connecting light-emitting elements and a second power supply line EL are formed in the fourth metal layer 214. Referring to FIG. 33 and FIG. 34, the connection electrode E1 is electrically connected to the transition electrode EE through a via hole, corresponding to the transition electrode EE, pre-configured in the second planarization layer 207.

To this end, the preparation of the drive layer 2 is completed, and the drive layer 2 has the first side wall 22 at the first opening 21. In the embodiment, the first side wall 22 has a step. It is to be noted that the preceding steps only show the example where film layer structures such as the first planarization layer 206 to the fourth metal layer 214 are formed after inorganic insulating layers such as the passivation layer 205 are etched, and this preparation process is not limiting. In other embodiments, after the passivation layer 205 and film layers below the passivation layer 205 are formed in FIG. 30, inorganic insulating layers such as the passivation layer 205 in the region where the first opening 21 is provided may not be etched, and after structures such as the patterned first planarization layer 206, the third metal layer 213, the patterned second planarization layer 207 and the fourth metal layer 214 are formed as described above, then the inorganic insulating layers such as the passivation layer 205 in the region where the first opening 21 is provided are etched.

Figure 36:
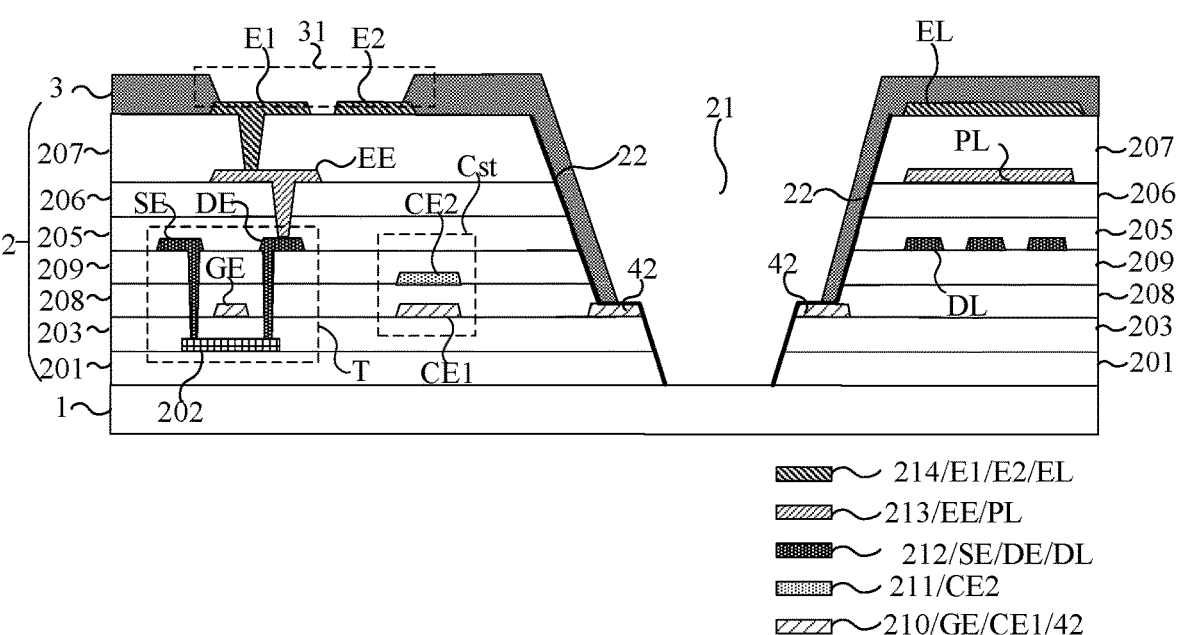

Next, in the eighth step, as shown in FIG. 36, a first light-shielding layer 3 is formed on one side of the drive layer 2 away from the base 1, and the first light-shielding layer 3 extends to the first side wall 22. Specifically, the material of the first light-shielding layer 3 may be a black optical adhesive. Since the black optical adhesive has fluidity, after the side of the drive layer 2 away from the base 1 is coated with the liquid black optical adhesive, the black optical adhesive will flow along the side wall of the drive layer 2. The first side wall 22 has at least one step, which is conducive to slowing down the flow of the black optical adhesive, so that the black optical adhesive stops flowing when flowing to the step surface; therefore, the contact between the black optical adhesive and the base can be avoided, and the peeling phenomenon of the first light-shielding layer 3 can be prevented. Further, as shown in FIG. 36, after the black optical adhesive is coated and cured, the black optical adhesive may be patterned by processes such as exposure and development so that a second opening 31 is formed to expose the connection electrode E1 and the connection electrode E2.

Figure 37:
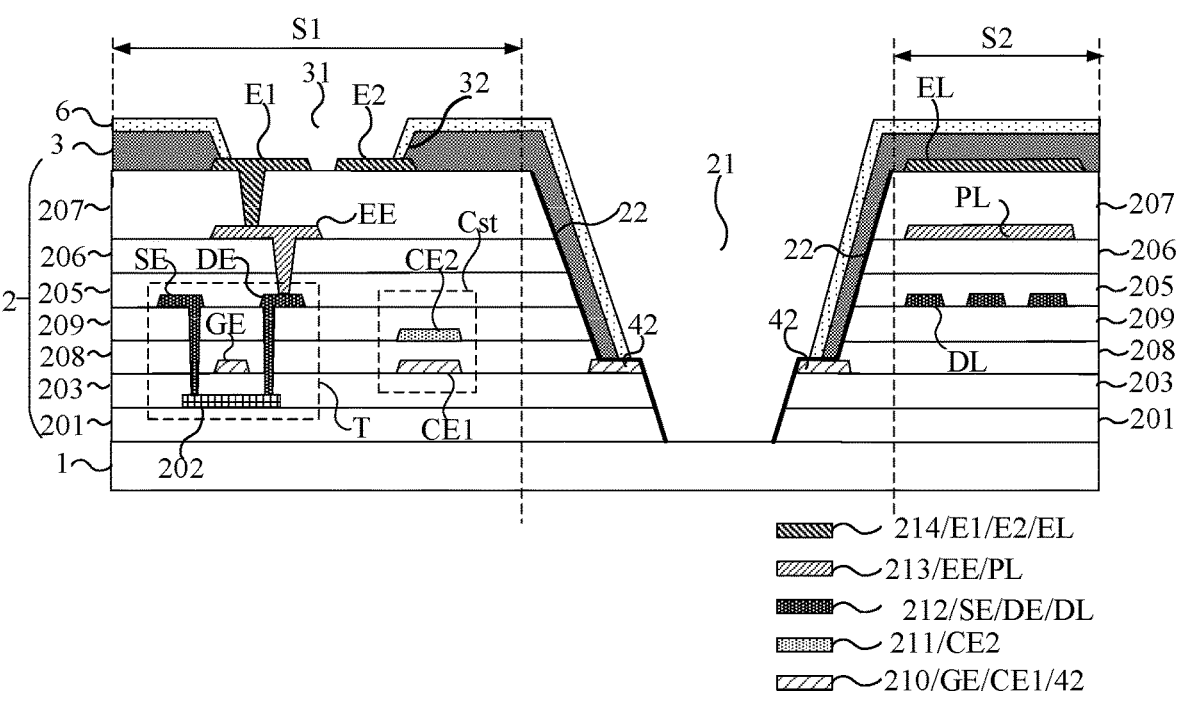

In the ninth step, as shown in FIG. 37, a protective layer 6 is formed on the first light-shielding layer 3 such that the protective layer 6 covers a side of the first light-shielding layer 3 away from the base 1 and covers the second side wall 32 of the first light-shielding layer 3 at the second opening 31 and part of the first light-shielding layer 3 extending to the first side wall 22. Exemplarily, a transparent optical adhesive may be selected as the material for preparing the protective layer 6. After the transparent optical adhesive is formed on the first light-shielding layer 3 and cured, the cured transparent optical adhesive may be patterned by processes such as exposure and development so that the protective layer shown in FIG. 37 is obtained. To this end, the preparation of the array substrate shown in FIG. 18 is completed. The array substrate preparation method configured in other embodiments may be understood with reference to this flow and is not repeated here.

As described above, the array substrate may further include a second light-shielding layer between the base and the drive layer, so that light radiated from the base to the active layer of the thin-film transistor in a circuit region can be shielded against by the second light-shielding layer. The second light-shielding layer being an organic light-shielding adhesive is taken as an example for further illustration of the array substrate preparation method. Exemplarily, FIG. 38 is a flowchart of another array substrate preparation method according to an embodiment of the present disclosure, and FIGS. 39 to 43 are flowcharts for preparation of the array substrate shown in FIG. 25. Referring to FIG. 38 and FIGS. 39 to 43, if the array substrate includes the second light-shielding layer, the array substrate preparation method may include steps described below.

In S911, a base is provided.

In S912, a drive layer is formed, where the drive layer is located on the base, a first opening is configured in the drive layer, the drive layer has a first side wall at the first opening, and the first side wall has at least one step.

Figure 39:
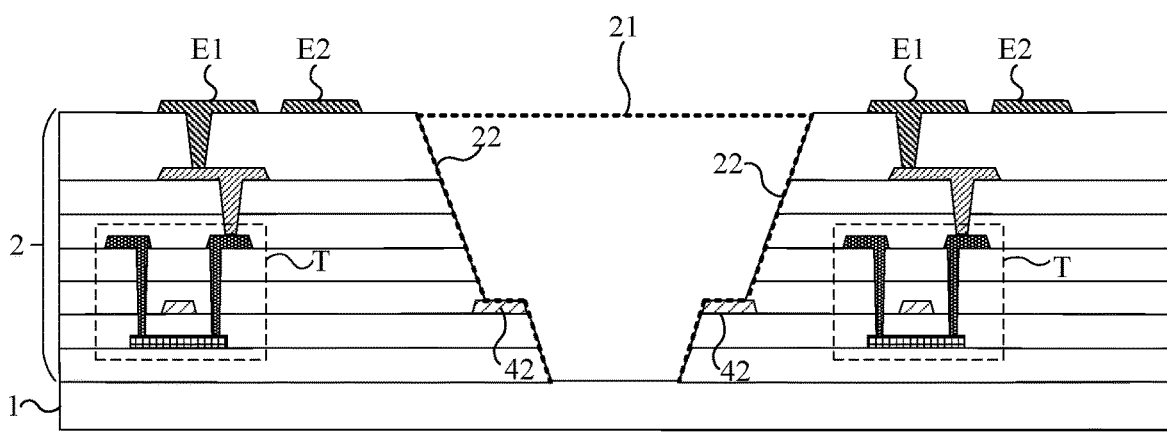
FIGS. 39 to 43 are flowcharts for preparation of the array substrate shown in FIG. 25.

Referring to FIG. 39, the drive layer 2 is formed on the base 1. The drive layer 2 specifically refers to a film layer structure located between connection electrodes (E1 and E2) and the base 1 and including the film layer where the connection electrodes (E1 and E2) are located. For the preparation process of the drive layer 2, reference may be made to the preceding description, which is not repeated here.

In S913, the drive layer is stripped from the base.

Figure 40:
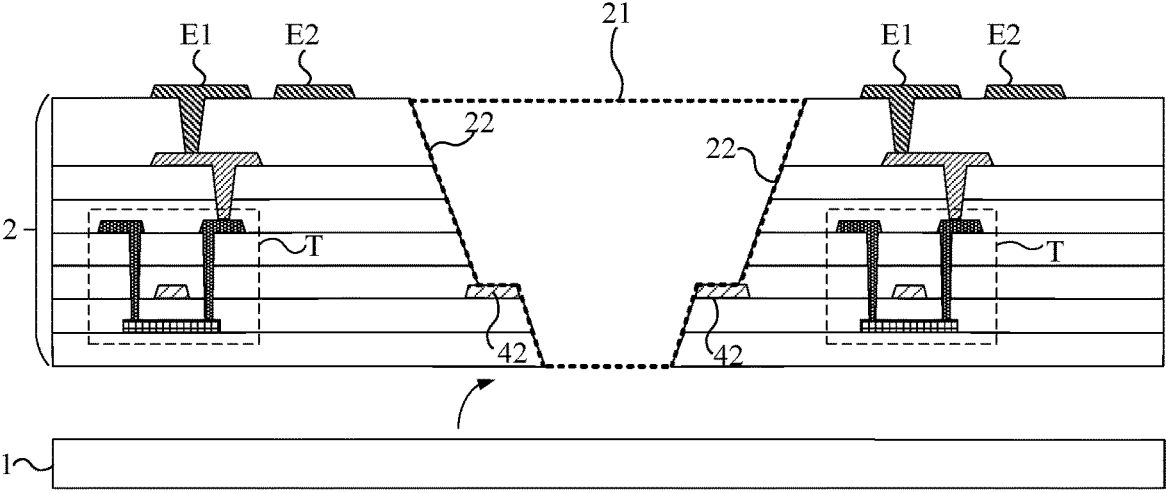

Referring to FIG. 40, after the preparation of the drive layer 2 is completed, the drive layer 2 may be stripped from the base 1 by using a film stripping technique.

In S914, a light-shielding substrate is provided, where the light-shielding substrate includes a transparent base and a second light-shielding layer, the second light-shielding layer is located on the transparent base, and the second light-shielding layer includes a third opening.

Figure 41:
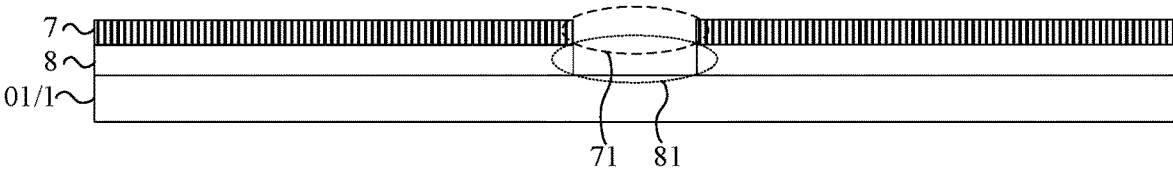

Referring to FIG. 41, the light-shielding substrate includes the transparent base 01 and the second light-shielding layer 7, the second light-shielding layer 7 is located on the transparent base 01, and the second light-shielding layer 7 includes the third opening 71. The transparent substrate 01 may be a new substrate, or the preceding base 1 obtained after the drive layer is stripped may be continuously used, which is not limited in the embodiment of the present disclosure. The second light-shielding layer 7 may be a black optical adhesive, and the third opening 71 may be formed by processes such as exposure and development. Specifically, the region where the third opening 71 is provided corresponds to the region where the first opening 21 is configured in the drive layer 2.

In addition, referring to FIG. 41, a third buffer layer 8 may be disposed between the second light-shielding layer 7 and the base 1, so that the risk of peeling of the second light-shielding layer 7 can be reduced. Optionally, the third buffer layer 8 has a fourth opening 81 configured in corresponding to the third opening 71 so that the impact on light transmittance reduced.

In 915, the drive layer is attached to the light-shielding substrate, where the first opening overlaps the third opening.

Figure 42:
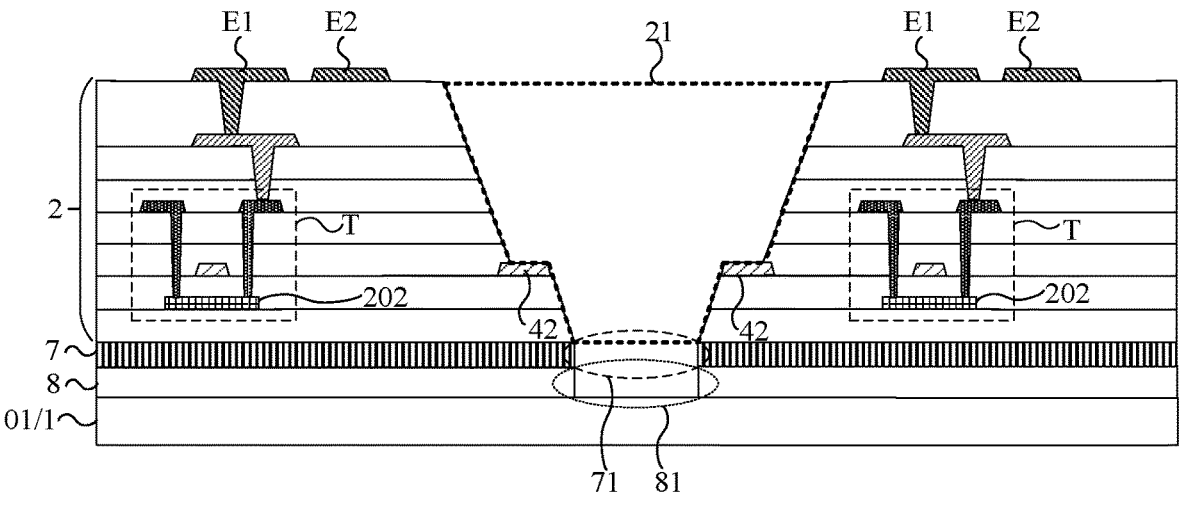

Referring to FIG. 42, the drive layer 2 is attached to the light-shielding substrate and is in contact with the second light-shielding layer 7, and the first opening 21 overlaps the third opening 71.

A high-temperature process may be required in the preparation of the drive layer. For example, during the preparation of a low-temperature polycrystalline silicon thin-film transistor, the low-temperature polycrystalline silicon needs to be formed by means of annealing; however, the temperature of the annealing process can reach thousands of degrees Celsius; therefore, if the organic second light-shielding layer is formed directly on the base and then the preparation of the drive layer is performed, the second light-shielding layer may be damaged during the high-temperature process, affecting the light-shielding effect. In the embodiment, the drive layer is first stripped from the base, and then the drive layer is attached to the light-shielding substrate on which the second light-shielding layer is formed, so that the damage to the second light-shielding layer by the high-temperature process can be avoided, and the light-shielding effect of the second light-shielding layer can be ensured.

In S916, a first light-shieling layer is formed, where the first light-shieling layer is located on the drive layer and extends to the first side wall.

Figure 43:
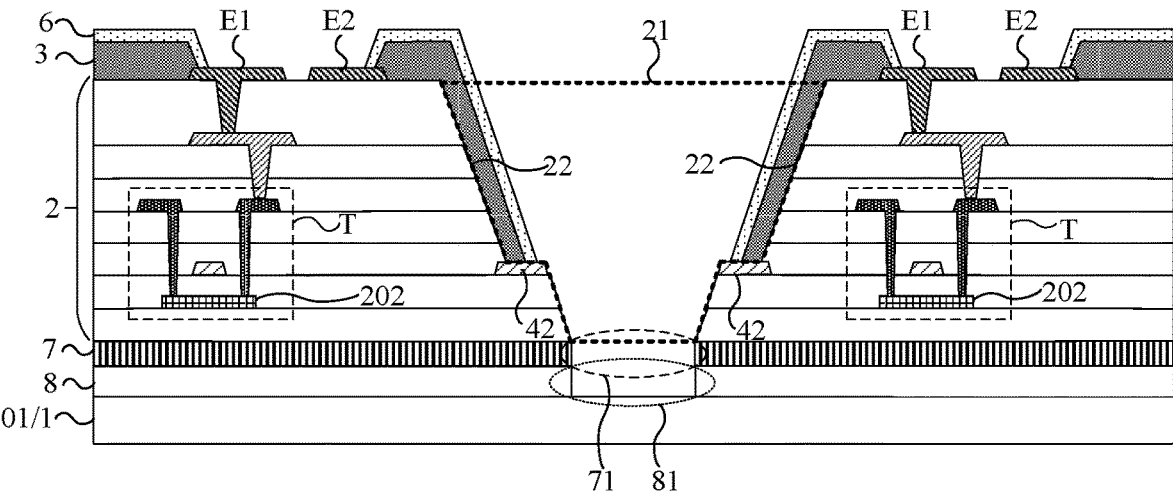

Referring to FIG. 43, the first light-shieling layer 3 is formed on the drive layer 2 and extends to the first side wall 22. In this manner, the first light-shieling layer 3 and the second light-shieling layer 7 can completely shield the internal structure of the drive layer 2 from light, so that problems such as light reflection and threshold shift of the thin-film transistor can be improved. In addition, as shown in FIG. 43, a protective layer 6 may be performed on the first light-shielding layer 3 to protect the first light-shielding layer 3, so that the light shielding effect of the first light-shielding layer 3 is ensured.

It is to be noted that the preceding embodiment only shows the example where after being formed, the drive layer 2 is stripped from the base 1 and attached to the light-shielding substrate on which the second light-shielding layer 7 is formed, and then the preparation of the first light-shielding layer 3 and the protective layer 6 is performed. In other embodiments, after the preparation of film layers such as the drive layer 2, the first light-shielding layer 3 and the protective layer 6 is completed on the base 1, the drive layer 2, the first light-shielding layer 3 and the protective layer 6 may be integrally stripped from the base 1, and then the drive layer 2, the first light-shielding layer 3 and the protective layer 6 are integrally attached to the light-shielding substrate on which the second light-shielding layer 7 is formed.

Finally, it is to be noted that the preceding array substrate/display panel may be applied to a transparent display device in any scene, which is not limited in the embodiment of the present disclosure.

The preceding specific embodiments do not limit the scope of the present disclosure. It is to be understood by those skilled in the art that various modifications, combinations, sub-combinations and substitutions may be performed according to design requirements and other factors. Any modification, equivalent substitution, improvement and the like made within the spirit and principle of the present disclosure is within the scope of the present disclosure.

What is claimed is:

1. An array substrate, comprising:
a base;
a drive layer, wherein the drive layer is formed on the base, a first opening is configured in the drive layer, the drive layer has a first side wall at the first opening, and the first side wall has at least one step; and
a first light-shielding layer, wherein the first light-shielding layer is formed on the drive layer and extends to the first side wall;
wherein the drive layer comprises a first film layer and a barrier structure which are in contact with each other, the first film layer is located between the barrier structure and the base, and an upper surface of the barrier structure comprises a step surface of the step;
the drive layer further comprises a second film layer, the second film layer covers the first film layer and at least part of the barrier structure, and is in contact with at least the first film layer.

2. The array substrate according to claim 1, wherein the first light-shielding layer is in contact with the at least one step.

3. The array substrate according to claim 1, wherein
a material of the barrier structure is different from a material of the first film layer;
wherein the material of the barrier structure comprises metal or a semiconductor, and the material of the first film layer comprises an inorganic material.

4. The array substrate according to claim 1, wherein the drive layer further comprises a second film layer, and the second film layer is in contact with the first film layer and extends to the first side wall;

the first film layer is located between the second film layer and the base; and
a material of the first film layer and a material of the second film layer are both inorganic materials.

5. The array substrate according to claim 1, wherein the barrier structure and the first film layer are even with each other at the first side wall.

6. The array substrate according to claim 1, wherein the drive layer further comprises a thin-film transistor and a capacitor;
the thin-film transistor comprises an active layer, a gate, a source and a drain, and the capacitor comprises a first capacitor plate and a second capacitor plate which are disposed opposite to each other; and
the barrier structure is disposed in a same layer as at least one of the active layer, the gate, the source, the drain, the first capacitor plate or the second capacitor plate.

7. The array substrate according to claim 1, wherein the drive layer further comprises a thin-film transistor, and the thin-film transistor comprises an active layer; and
a film layer where the barrier structure is located is disposed between a film layer where the active layer is located and the base;
wherein the drive layer further comprises a first buffer layer, and the first buffer layer is located between the active layer and the base; and
the film layer where the barrier structure is located is disposed between the first buffer layer and the base;
wherein the drive layer further comprises a second buffer layer, and the second buffer layer is located between the barrier structure and the base.

8. The array substrate according to claim 1, wherein the array substrate comprises a circuit region and a line region;
the drive layer comprises a thin-film transistor and a plurality of signal lines, the thin-film transistor is located in the circuit region, and the plurality of signal lines are located in the line region;
the circuit region and a region where the first opening is located are adjacently configured along a first direction, and the line region and the region where the first opening is located are adjacently configured along a second direction, wherein the first direction and the second direction intersect and are both parallel to a plane where the base is located; and
the barrier structure is located between the circuit region and the first opening, and/or the barrier structure is located between the line region and the first opening.

9. The array substrate according to claim 8, wherein the barrier structure is located between the line region and the first opening; and
the barrier structure is disposed in a same layer as the plurality of signal lines, or a film layer where the barrier structure is located is disposed between a film layer where the plurality of signal lines are located and the base.

10. The array substrate according to claim 1, wherein the barrier structure surrounds the first opening.

11. The array substrate according to claim 10, wherein an edge of the barrier structure comprises at least one of a straight line, a broken line or a wavy line.

12. The array substrate according to claim 1, wherein the drive layer comprises connection electrodes, second openings are configured in the first light-shielding layer, and the second openings expose the connection electrodes;
wherein the array substrate further comprises: a protective layer, wherein the protective layer is formed on the first light-shielding layer; and the protective layer extends from a second opening to the first opening, and the protective layer covers a second side wall of the first light-shielding layer at the second opening and covers part of the first light-shielding layer extending to the first side wall.

13. The array substrate according to claim 1, further comprising a second light-shielding layer, wherein the second light-shielding layer is located between the drive layer and the base; and the second light-shielding layer comprises a third opening, and the third opening overlaps the first opening.

14. The array substrate according to claim 13, wherein the second light-shielding layer is an organic light-shielding adhesive.

15. The array substrate according to claim 1, wherein film layers of the drive layer comprises an active layer, a gate insulating layer, a first metal layer, a first interlayer insulating layer, a capacitor metal layer, a second interlayer insulating layer, a second metal layer, a passivation layer, a first planarization layer, a third metal layer, a second planarization layer and a fourth metal layer which are laminated in sequence; and a connection electrode of the drive layer is located in the fourth metal layer.

16. A display panel, comprising: an array substrate and a light-emitting element, wherein the light-emitting element is located on one side of the drive layer away from a base, and the light-emitting element is electrically connected to the drive layer;

wherein the array substrate comprises:

a base;

a drive layer, wherein the drive layer is formed on the base, a first opening is configured in the drive layer, the drive layer has a first side wall at the first opening, and the first side wall has at least one step; and a first light-shieling layer, wherein the first light-shielding layer is formed on the drive layer and extends to the first side wall;

wherein the drive layer comprises a first film layer and a barrier structure which are in contact with each other, the first film layer is located between the barrier structure and the base, and an upper surface of the barrier structure comprises a step surface of the step;

the drive layer further comprises a second film layer, the second film layer covers the first film layer and at least part of the barrier structure, and is in contact with at least the first film layer; and wherein the array substrate further comprises:

an encapsulation layer, wherein the encapsulation layer covers the light-emitting element and the first light-shielding layer, and the encapsulation layer fills the first opening.

17. An array substrate preparation method, comprising:

providing a base;

forming a drive layer, wherein the drive layer is located on the base, a first opening is configured in the drive layer, the drive layer has a first side wall at the first opening, and the first side wall has at least one step; and forming a first light-shieling layer, wherein the first light-shieling layer is located on the drive layer and extends to the first side wall;

wherein forming the drive layer comprises:

forming a first film:

forming a barrier structure, wherein the barrier structure is located on the first film and is in contact with the first film;

forming a second film, wherein the second film covers the barrier structure and the first film and is in contact with both the barrier structure and the first film;

patterning the first film and the second film to form the first opening of the drive layer, wherein the first film is patterned to form a first film layer, and the second film is patterned to form a second film layer; and exposing, by the second film layer, the barrier structure at the first opening.

18. The array substrate preparation method according to claim 17, after forming the drive layer, further comprising:

stripping the drive layer from the base;

providing a light-shielding substrate, wherein the light-shielding substrate comprises a transparent base and a second light-shielding layer, the second light-shielding layer is located on the transparent base, and the second light-shielding layer comprises a third opening; and attaching the drive layer to the light-shielding substrate, wherein the first opening overlaps the third opening.

* * * * *